US012588205B2

(12) United States Patent
Kim et al.

(10) Patent No.: US 12,588,205 B2
(45) Date of Patent: Mar. 24, 2026

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Siwan Kim, Suwon-si (KR); Juwon Im, Suwon-si (KR); Jonghyun Park, Suwon-si (KR); Sori Lee, Suwon-si (KR); Bongtae Park, Suwon-si (KR); Jaejoo Shim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 465 days.

(21) Appl. No.: 18/183,469

(22) Filed: Mar. 14, 2023

(65) Prior Publication Data

US 2024/0315021 A1      Sep. 19, 2024

(30) Foreign Application Priority Data

Aug. 1, 2022      (KR) ........................ 10-2022-0095585

(51) Int. Cl.
*H10B 43/27* (2023.01)
*H01L 23/528* (2006.01)
(Continued)

(52) U.S. Cl.
CPC ......... *H10B 43/27* (2023.02); *H01L 23/5283* (2013.01); *H10B 41/10* (2023.02);
(Continued)

(58) Field of Classification Search
CPC ........ H10B 43/27; H10B 41/10; H10B 43/35; H10B 41/35; H10B 43/10; H10B 41/27; H01L 23/5283
See application file for complete search history.

(56) References Cited

U.S. PATENT DOCUMENTS 10,937,797 B2      3/2021  Seo et al.
2014/0097484 A1*   4/2014  Seol .................... H01L 23/5226
                                                          257/324
(Continued)

FOREIGN PATENT DOCUMENTS

KR      10-2019-0016258 A      2/2019
KR      10-2022-0092822 A      7/2022

OTHER PUBLICATIONS

Office Action in Korean Appln. No. 10-2022-0095585, mailed on Feb. 23, 2026, 9 pages (with English translation).

*Primary Examiner* — Richard A Booth
(74) *Attorney, Agent, or Firm* — Fish & Richardson P.C.

(57)      ABSTRACT

A semiconductor device includes a first semiconductor structure including a first substrate and circuit devices; and a second semiconductor structure including a second substrate on the first semiconductor structure and having a first region and a second region, gate electrodes in the first region and stacked in a first direction, and extending in the second region by different lengths in a second direction, channel structures extending by penetrating through the gate electrodes, separation regions penetrating through the gate electrodes, extending in the second direction, spaced apart from each other in a third direction, and defining a center block region and an edge block region, and substrate insulating layers in the second substrate between the separation regions in the second region. A width of the substrate insulating layers in the third direction is greater in the edge block region than in the center block region.

20 Claims, 22 Drawing Sheets

(51) Int. Cl.
| | |
|---|---|
| *H10B 41/10* | (2023.01) |
| *H10B 41/27* | (2023.01) |
| *H10B 41/35* | (2023.01) |
| *H10B 43/10* | (2023.01) |
| *H10B 43/35* | (2023.01) |

(52) U.S. Cl.
CPC ............. *H10B 41/27* (2023.02); *H10B 41/35* (2023.02); *H10B 43/10* (2023.02); *H10B 43/35* (2023.02)

(56)          References Cited

U.S. PATENT DOCUMENTS

| | | | |
|---|---|---|---|
| 2015/0340366 A1* | 11/2015 | Lim ....................... | G11C 16/10 |
| | | | 257/401 |
| 2020/0176375 A1 | 6/2020 | Jung et al. | |
| 2020/0203366 A1 | 6/2020 | Kim et al. | |
| 2020/0212061 A1 | 7/2020 | Choi et al. | |
| 2020/0350326 A1 | 11/2020 | Yun et al. | |
| 2021/0074724 A1 | 3/2021 | Kim et al. | |
| 2021/0202457 A1* | 7/2021 | Choi ....................... | H01L 24/08 |

* cited by examiner

C1-C1'

Z

X⊙→Y 110 101

SEMICONDUCTOR DEVICE AND ELECTRONIC SYSTEM INCLUDING THE SAME

CROSS-REFERENCE TO RELATED APPLICATION(S)

This application claims benefit of priority to Korean Patent Application No. 10-2022-0095585 filed on Aug. 1, 2022 in the Korean Intellectual Property Office, the disclosure of which is incorporated herein by reference in its entirety.

BACKGROUND

Various example embodiments relate to a semiconductor device and/or an electronic system including the same.

A semiconductor device storing high-capacity data in an electronic system requiring data storage has been necessary or desirable. Accordingly, a method for increasing data storage capacity of a semiconductor device has been studied. For example, as one method increasing the data storage capacity of a semiconductor device, a semiconductor device including memory cells disposed three-dimensionally, instead of memory cells disposed two-dimensionally, has been suggested.

SUMMARY

Various example embodiments provide a semiconductor device having improved electrical properties and/or improved reliability.

Alternatively or additionally, various example embodiments provide an electronic system including a semiconductor device having improved electrical properties and improved reliability.

According to some example embodiments, a semiconductor device includes a substrate having a first region and a second region; gate electrodes on the first region of the substrate and stacked and spaced apart from each other in a first direction perpendicular to an upper surface of the substrate, and extending on the second region of the substrate by different lengths in a second direction perpendicular to the first direction; channel structures on the first region of the substrate and penetrating through the gate electrodes and extending perpendicularly to the substrate; separation regions penetrating through the gate electrodes, extending in the second direction, spaced apart from each other in a third direction perpendicular to the first and second directions, and defining a center block region and an edge block region on an external side of the center block region; and substrate insulating layers in the second region of the substrate. The substrate insulating layers have a first width, a first spacing, and a first pitch which is a sum of the first width and the first spacing in the third direction below the center block region, wherein the substrate insulating layers have a second width, a second spacing, and a second pitch which is a sum of the second width and the second spacing in the third direction below the edge block region, and wherein equations (1) to (3) as below are satisfied, and X is a positive number.

$$\text{second pitch} = \text{first pitch} + X \qquad \text{Equation (1)}$$

$$\text{second spacing} \leq \text{first spacing} + X/2 \qquad \text{Equation (2)}$$

$$\text{first width} + X/2 \leq \text{second width} \qquad \text{Equation (3)}$$

According to various example embodiments, a semiconductor device includes a first semiconductor structure including a first substrate and circuit devices on the first substrate; and a second semiconductor structure including a second substrate on the first semiconductor structure and having a first region and a second region, gate electrodes in the first region and stacked and spaced apart from each other in a first direction perpendicular to an upper surface of the second substrate, and extending in the second region by different lengths in a second direction perpendicular to the first direction, channel structures extending by penetrating through the gate electrodes, separation regions penetrating through the gate electrodes, extending in the second direction, spaced apart from each other in a third direction perpendicular to the first and second directions, and defining a center block region and an edge block region on an external side of the center block region, and substrate insulating layers in the second substrate between the separation regions in the second region. A width of the substrate insulating layers in the third direction is greater in the edge block region than in the center block region.

According to various example embodiments, an electronic system includes a semiconductor device including a first semiconductor structure including a first substrate and circuit devices on the first substrate; and a second semiconductor structure including a second substrate on the first semiconductor structure and having a first region and a second region, gate electrodes in the first region and stacked and spaced apart from each other in a first direction perpendicular to an upper surface of the second substrate, and extending in the second region by different lengths in a second direction perpendicular to the first direction, channel structures extending by penetrating through the gate electrodes, separation regions penetrating through the gate electrodes, extending in the second direction, spaced apart from each other in a third direction perpendicular to the first and second directions, and defining a center block region and an edge block region on an external side of the center block region on the first and second regions, substrate insulating layers in the second substrate between the separation regions in the second region, and input/output pads electrically connected to the circuit devices. A pitch of the substrate insulating layers in the third direction is greater in the edge block region than in the center block region, and a width of the substrate insulating layers in the third direction is greater in the edge block region than in the center block region. The electronic system further comprises a controller electrically connected to the semiconductor device through the input/output pad and configured to control the semiconductor device.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, various example embodiments will be described as follows with reference to the accompanying drawings.

Figure 1A:
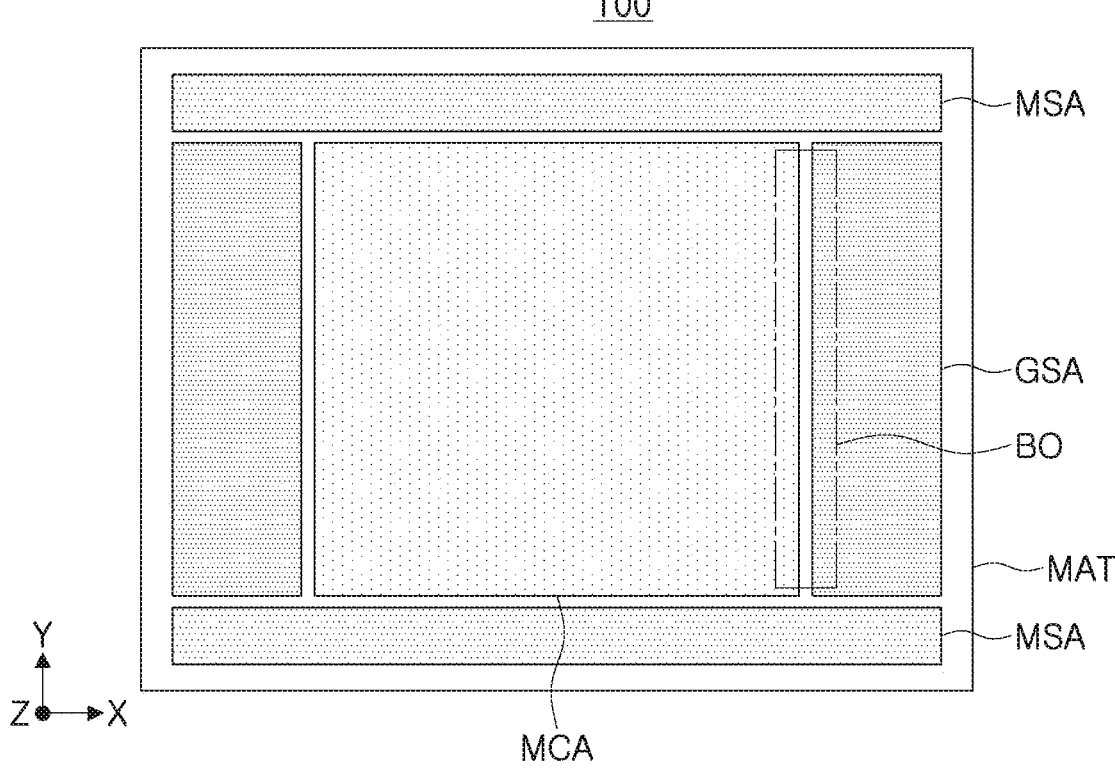
FIG. 1A is a plan diagram illustrating a semiconductor device according to various example embodiments.

FIG. 1A is a plan diagram illustrating a semiconductor device according to various example embodiments.

Figure 1B:
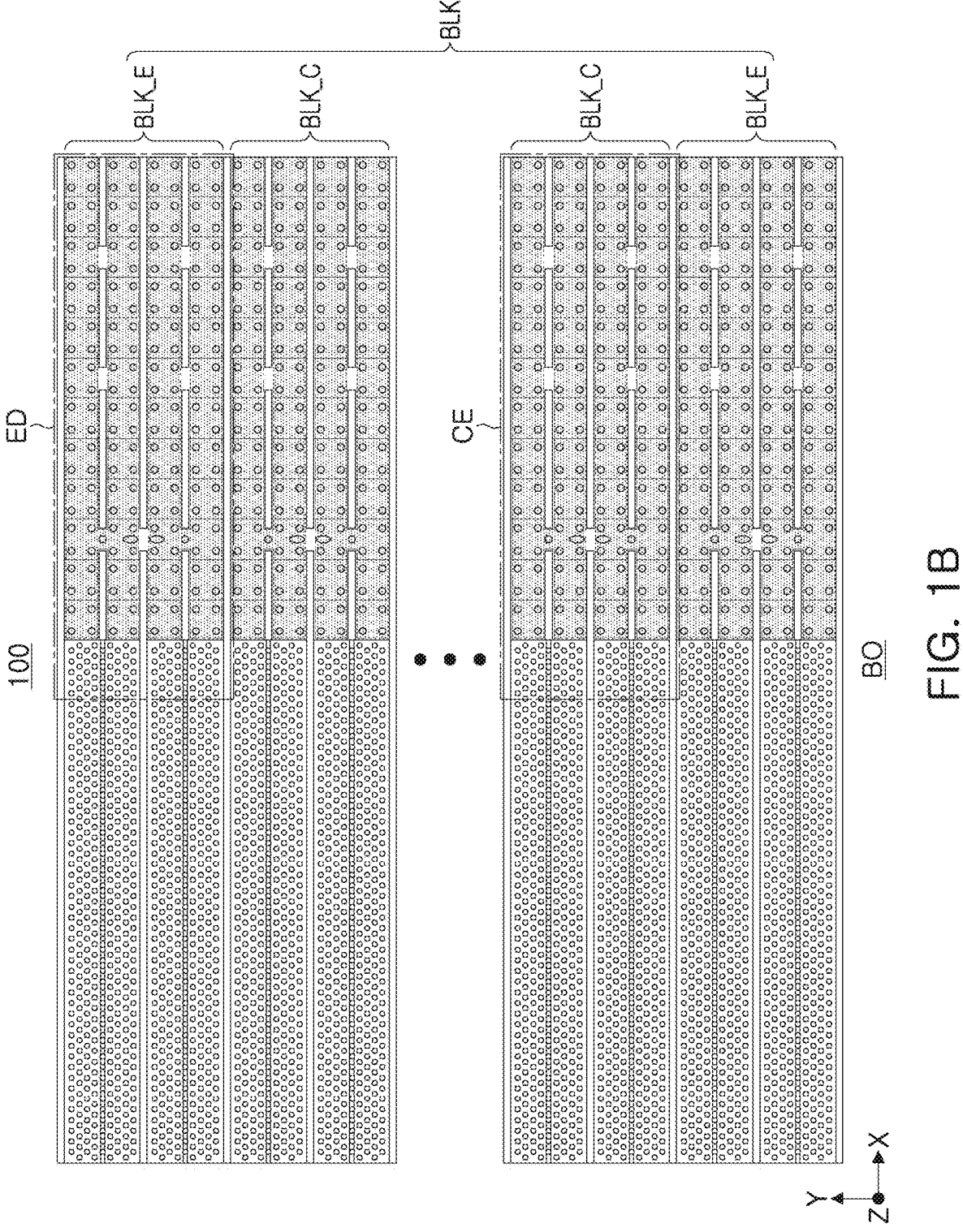
FIG. 1B is an enlarged plan diagram illustrating a portion of a semiconductor device according to various example embodiments.

FIG. 1B is an enlarged plan diagram illustrating a portion of a semiconductor device according to various example embodiments, illustrating region "BO" in FIG. 1A.

Figure 2A:
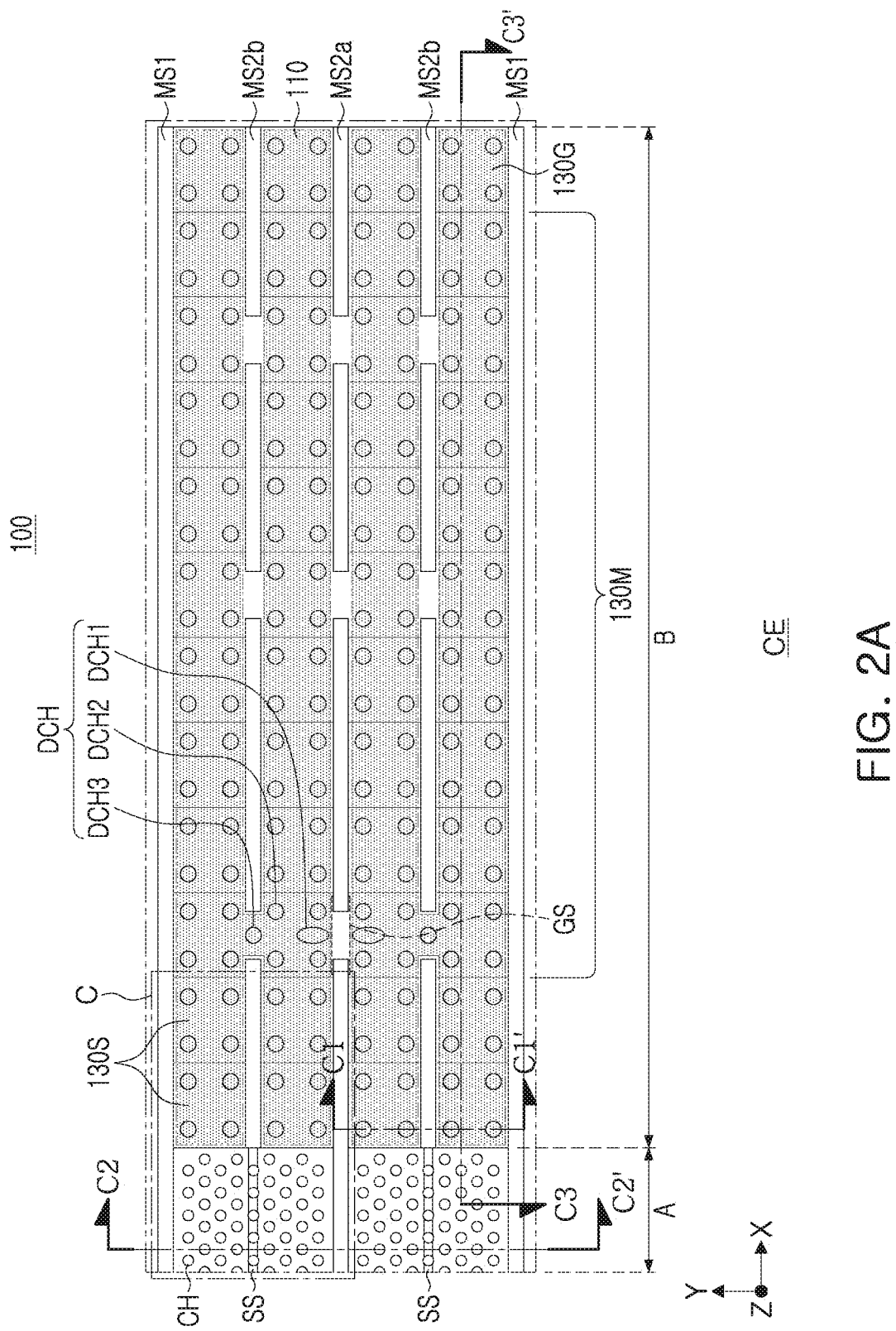
FIG. 2A is an enlarged plan diagram illustrating a portion of a semiconductor device according to various example embodiments.

FIG. 2A is an enlarged plan diagram illustrating a portion of a semiconductor device according to various example embodiments, illustrating region "CE" in FIG. 1B.

Figure 2B:
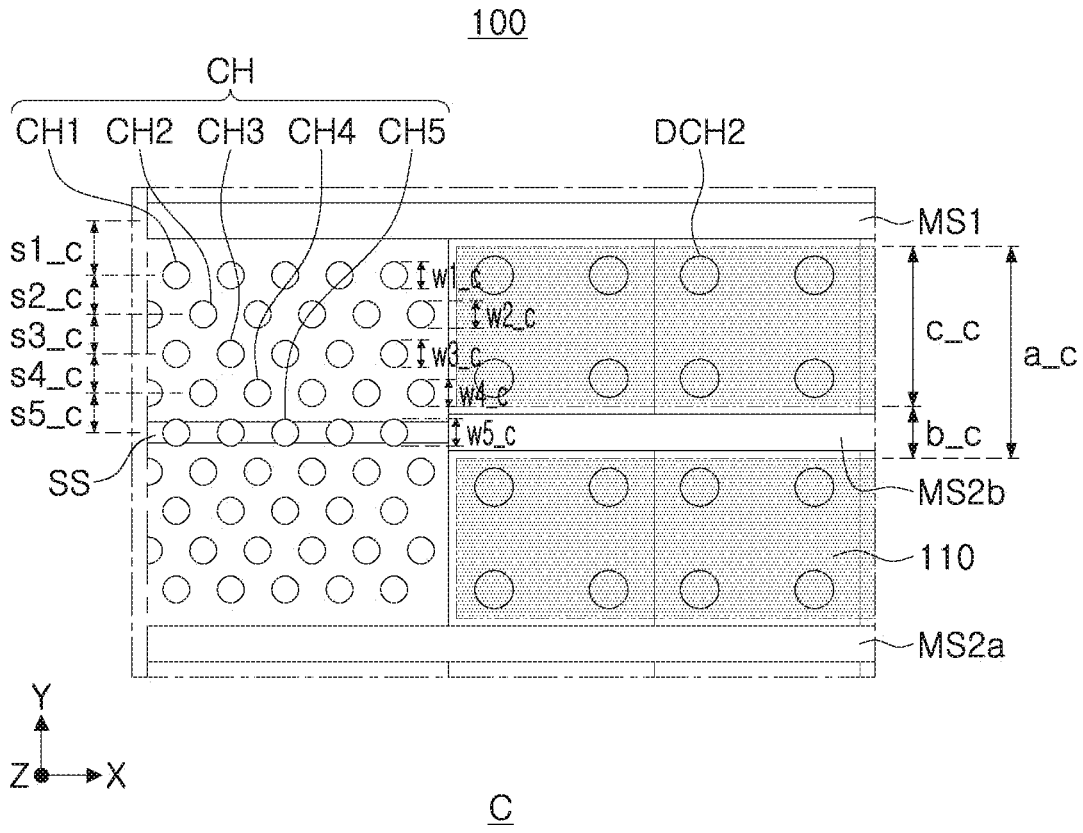
FIG. 2B is an enlarged plan diagram illustrating a portion of a semiconductor device according to various example embodiments.

FIG. 2B is an enlarged plan diagram illustrating a portion of a semiconductor device according to various example embodiments, illustrating region "C" in FIG. 2A.

Figure 3A:
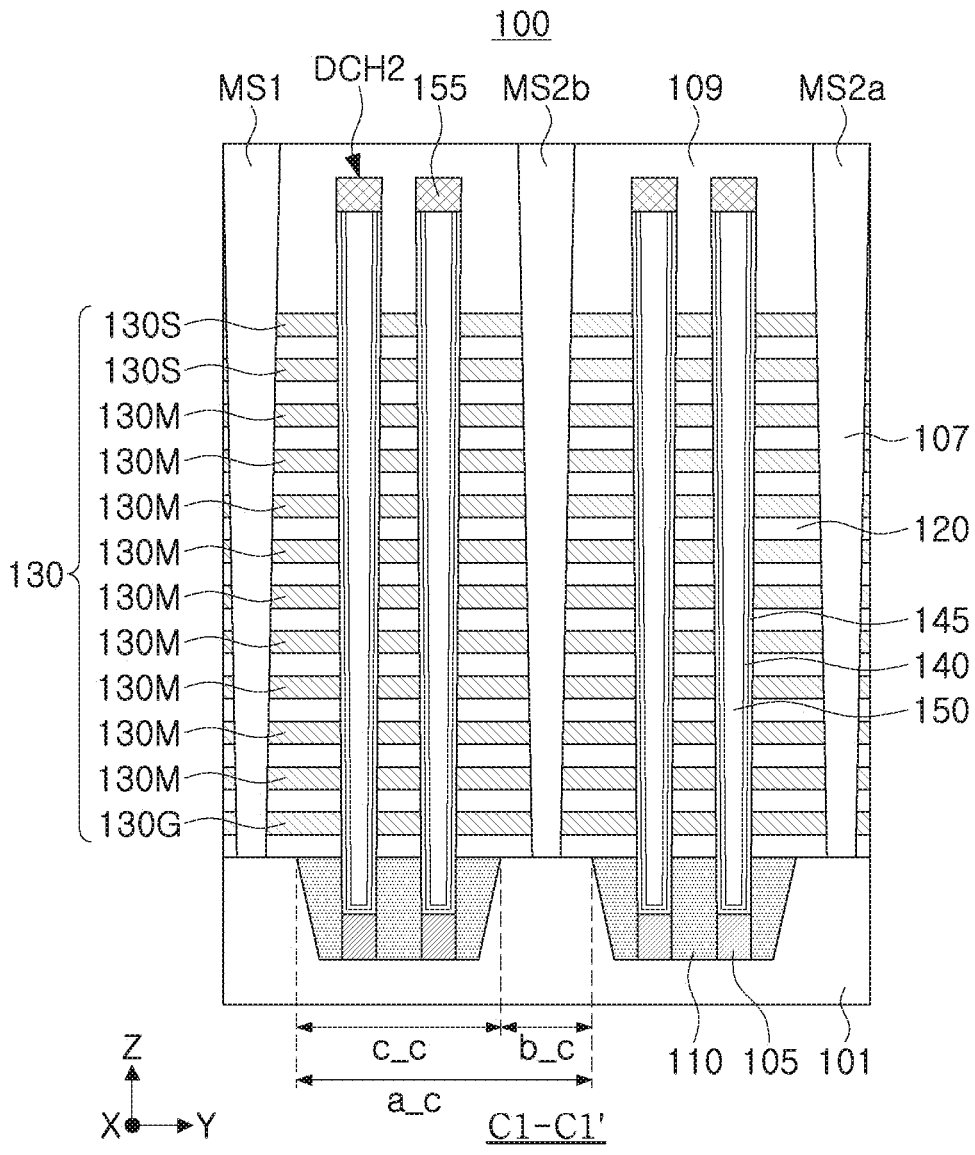
FIG. 3A is a cross-sectional diagram illustrating a semiconductor device according to various example embodiments.
Figure 3B:
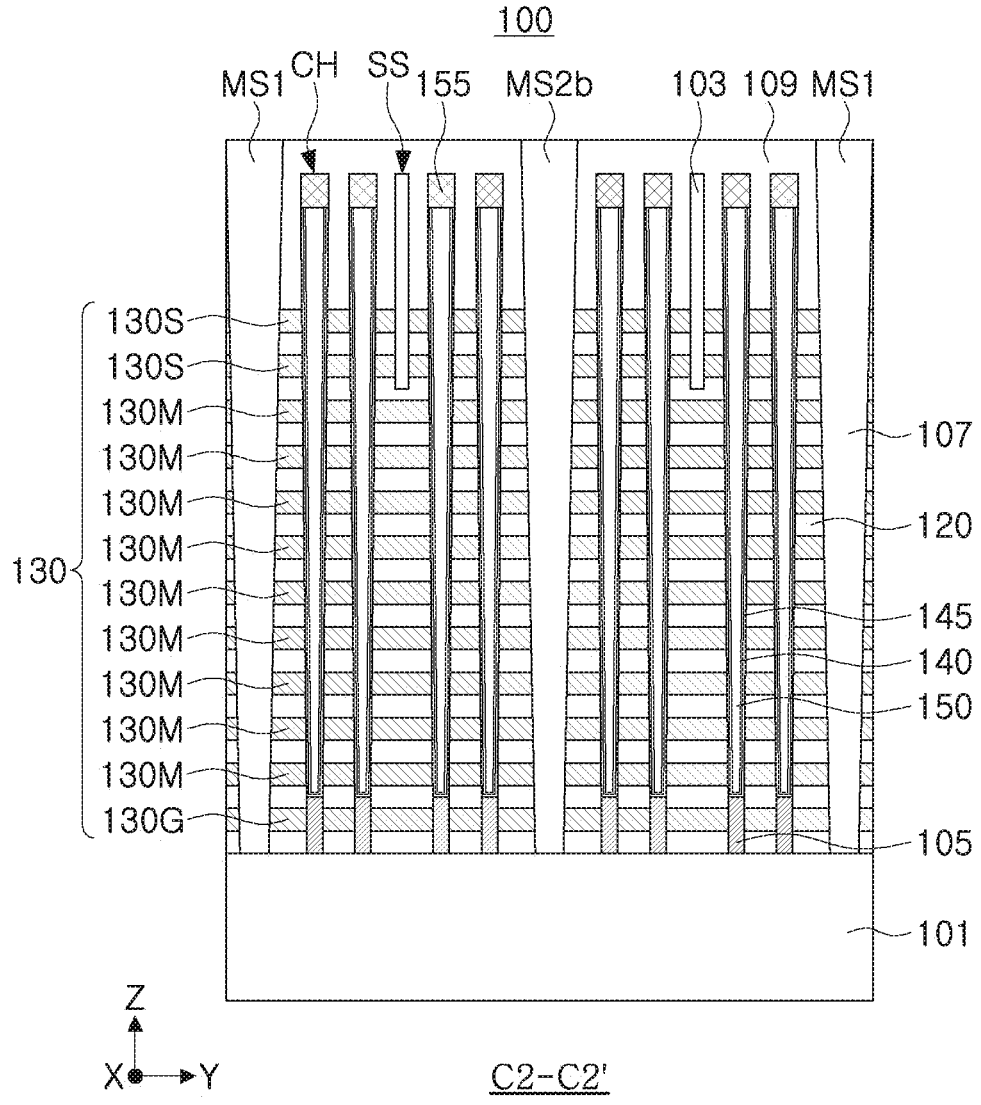
FIG. 3B is a cross-sectional diagram illustrating a semiconductor device according to various example embodiments.
Figure 3C:
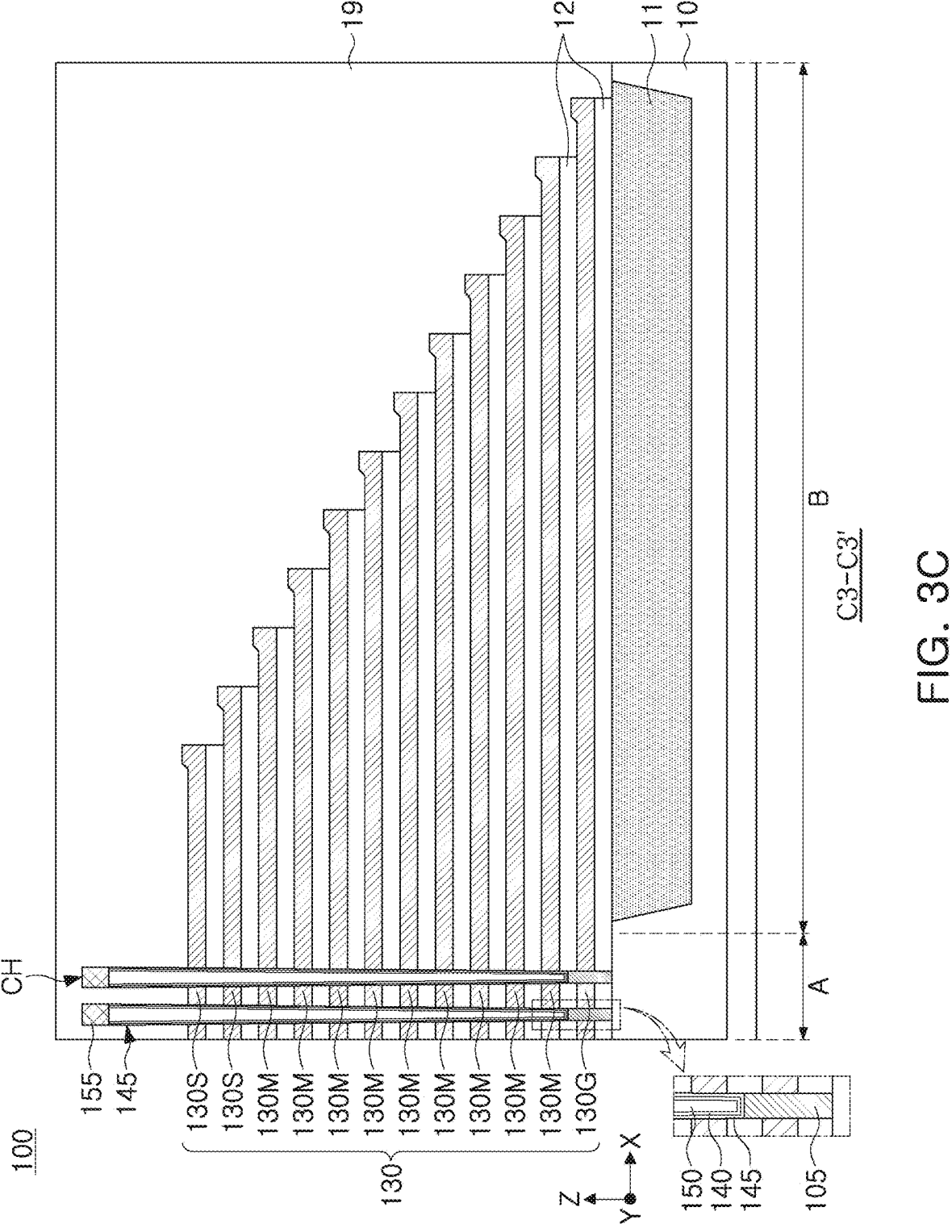
FIG. 3C is a cross-sectional diagram illustrating a semiconductor device according to various example embodiments.

FIGS. 3A to 3C are cross-sectional diagrams illustrating a semiconductor device according to various example embodiments, illustrating cross-sections taken along C1-C1', C2-C2', C3-C3' in FIG. 2A.

Figure 4A:
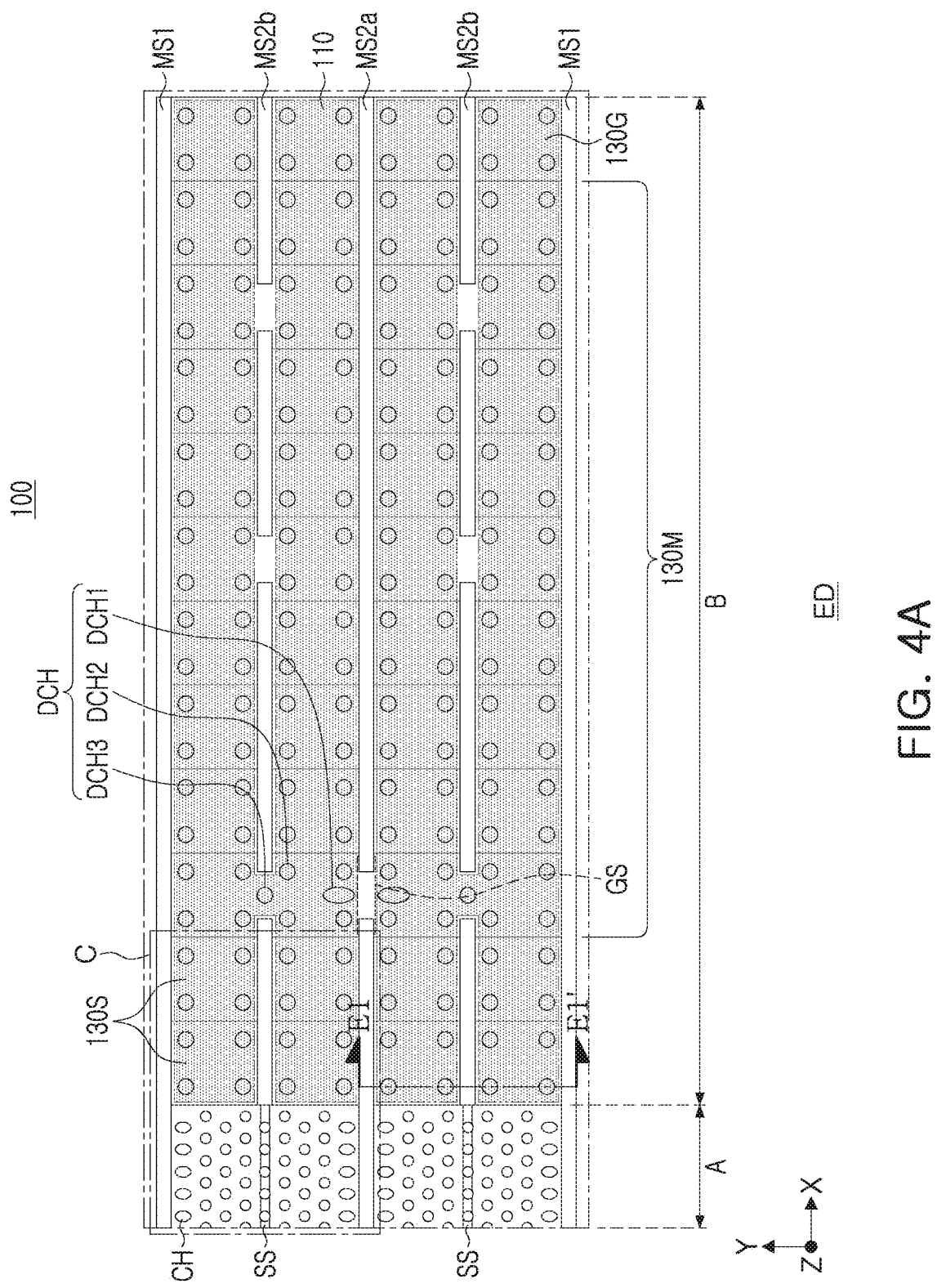
FIG. 4A is an enlarged plan diagram illustrating a portion of a semiconductor device according to various example embodiments.

FIG. 4A is an enlarged plan diagram illustrating a portion of a semiconductor device according to various example embodiments, illustrating region "ED" in FIG. 1B.

Figure 4B:
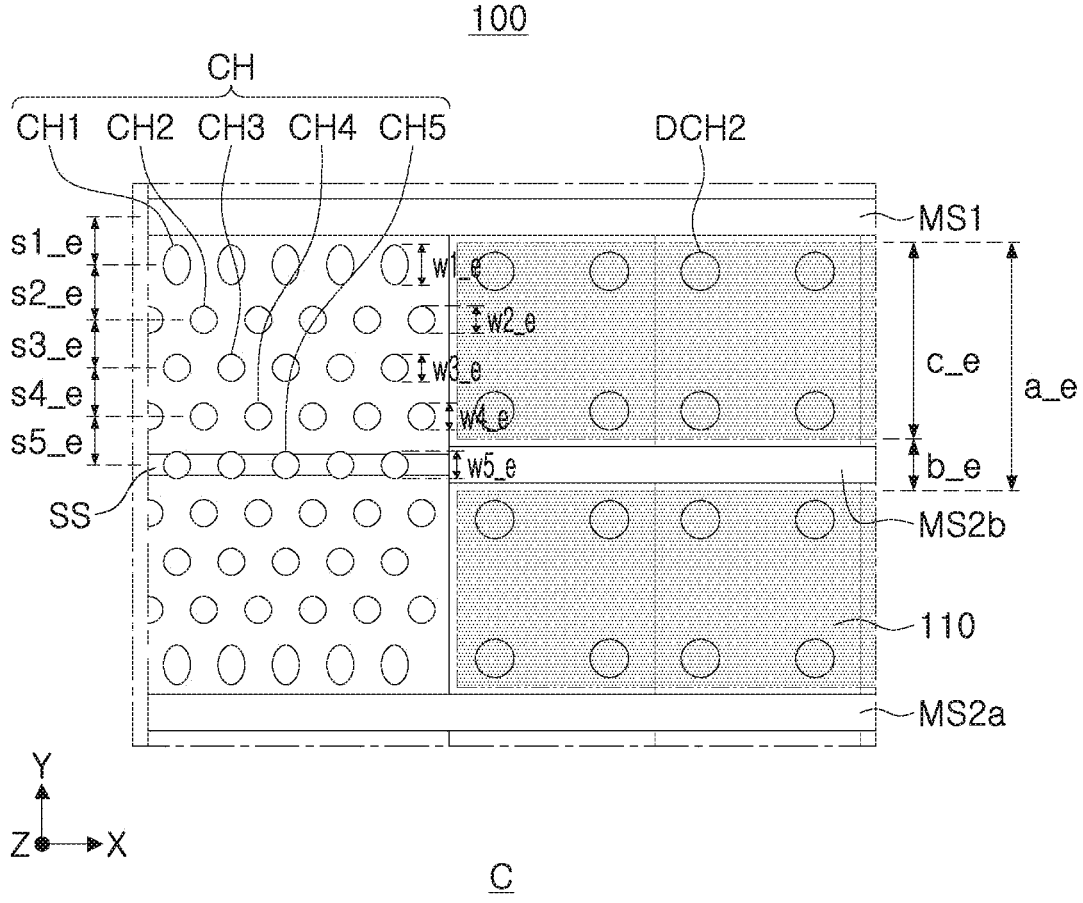
FIG. 4B is an enlarged plan diagram illustrating a portion of a semiconductor device according to various example embodiments.

FIG. 4B is an enlarged plan diagram illustrating a portion of a semiconductor device according to various example embodiments, illustrating region "C" in FIG. 4A.

Figure 5:
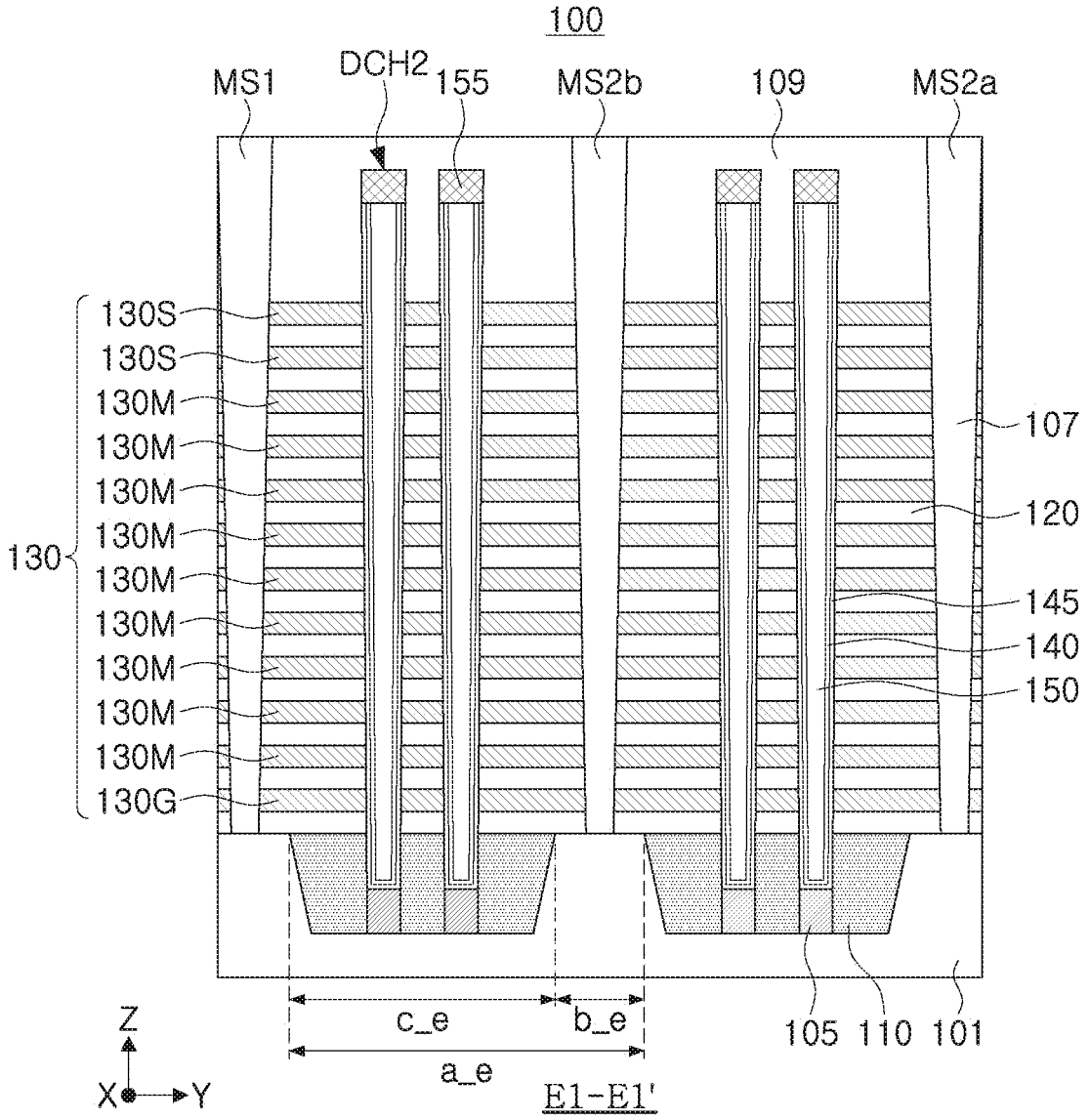
FIG. 5 is a cross-sectional diagram illustrating a semiconductor device according to various example embodiments.

FIG. 5 is a cross-sectional diagram illustrating a semiconductor device according to various example embodiments, illustrating a cross-section taken along E1-E1' in FIG. 4A.

Referring to FIGS. 1A to 5, the semiconductor device 100 may include one or more mats MAT. Each of or at least one of the mats MAT may include a memory cell array region MCA, a gate step region GSA, and a mold step region MSA.

The memory cell array region MCA and the gate step region GSA may correspond to the a region A and a second region B, respectively.

The mats MAT may include block regions BLK. The block regions BLK may include a center block region BLK_C and an edge block region BLK_E. The number of each of the center block region BLK_C and the edge block region BLK_E may be more than one, and is not limited to the example illustrated in FIG. 1B. The edge block region BLK_E may be disposed on an external side of the center block region BLK_C.

The semiconductor device 100 may include a substrate 101 having a first region A and a second region B, substrate insulating layers 110 disposed in the substrate 101 in the second region B, gate electrodes 130 stacked on the substrate 101, channel structures CH and dummy channel structures DCH disposed to penetrate the gate electrodes 130, first and second separation regions MS1, MS2a, and MS2b extending by penetrating through the gate electrodes 130, upper separation regions SS penetrating a portion of the gate electrodes 130 disposed in an uppermost portion, and a lower separation region GS penetrating through a portion of the at least one gate electrode 130 disposed in a lowermost portion. The channel structures CH may include a channel layer 140, a gate dielectric layer 145, a channel insulating layer 150, and a channel pad 155. The semiconductor device 100 may further include an interlayer insulating layer 120 and a cell region insulating layer 190 alternately stacked on the substrate 101 with the gate electrodes 130.

In the first region A of the substrate 101, the gate electrodes 130 may be vertically stacked and the channel structures CH may be disposed, and the first region A may correspond to the memory cell array 20 in FIG. 1. In the second region B, the gate electrodes 130 may extend by different lengths and dummy channel structures DCH may be disposed, and the second region B may electrically connect the memory cell array 20 to the peripheral circuit 30 in FIG. 1. The second region B may be disposed on at least one end of the first region A in at least one direction, for example, the X-direction.

The substrate 101 may have an upper surface extending in the X-direction and the Y-direction. The substrate 101 may be or may include a semiconductor material, such as, for example, one or more of a group IV semiconductor, a group III-V compound semiconductor, or a group II-VI oxide semiconductor. For example, the group IV semiconductor may include one or more of silicon, germanium, or silicon-germanium. The substrate 101 may be provided as a bulk wafer or as an epitaxial layer, and may be doped or undoped.

The substrate insulating layers 110 may be disposed in the substrate 101 in the second region B of the substrate 101. The substrate insulating layers 110 may be disposed between first separation regions MS1, second central separation regions MS2a, and a lower separation region GS in the second region B, and between second auxiliary separation regions MS2b. The substrate insulating layers 110 may not extend to a region in which the second central separation regions MS2a are spaced apart from each other in the X-direction. The substrate insulating layers 110 may extend to a portion of the regions in which the second auxiliary separation regions MS2b are spaced apart from each other in the X-direction, for example, a spaced region most adjacent to the first region A, and may not extend to another spaced region. However, in some example embodiments, the substrate insulating layers 110 may extend to overall regions in which the second auxiliary separation regions MS2b are spaced apart from each other in the X-direction.

The substrate insulating layers 110 may be or may be formed by, for example, a shallow trench isolation (STI) process. The substrate insulating layers 110 may extend from the upper surface of the substrate 101 into the substrate 101 to a predetermined depth. The substrate insulating layers 110 may be or may be formed of an insulating material, and may include, for example, oxide, nitride, or a combination thereof. The substrate insulating layers 110 may also be described as included in an insulating region of the substrate 101, and in this case, the substrate 101 may include an insulating region corresponding to the substrate insulating layers 110 and a conductive region formed by a semiconductor region.

The substrate insulating layers 110 may surround lower side surfaces of the dummy channel structures DCH. During the process of manufacturing the semiconductor device 100, the dummy channel structures DCH may be bent. When the dummy channel structures DCH are bent, the substrate insulating layers 110 may not sufficiently surround the lower side surfaces of the dummy channel structures DCH, and the side surfaces of a lower portion of the dummy channel structures DCH may be in contact with the conductive region of the substrate 101. When the side surfaces of the lower portion of the dummy channel structures DCH are in contact with the conductive region of the substrate 101, a defect may occur. In the edge block region BLK_E than in the center block region BLK_C, it may be likely or highly likely that a defect due to bending of the dummy channel structures DCH occurs. The defect may be prevented or reduced in likelihood of occurrence by increasing the width of the substrate insulating layers 110 to prevent or reduce lower side surfaces of the dummy channel structures DCH from being in contact with the conductive region of the substrate 101. In various example embodiments, as illustrated in FIGS. 2B, 3A, 4B, and 5, the width, spacing, and pitch of the substrate insulating layers 110 in the third direction Y may be different in the center block region BLK_C and the edge block region BLK_E. In the center block region BLK_C, the substrate insulating layers 110 may have a first width c_c, a first spacing b_c, and a first pitch a_c which is the sum of the first width c_c and the first spacing b_c. In the edge block region BLK_E, the substrate insulating layers 110 may have a second width c_e, a second spacing b_e, and a second pitch a_e which is the sum of the second width c_e and the second spacing b_e. The substrate insulating layers 110 may satisfy equations (1) to (3) as below. In some example embodiments, equations (4) and (5) as below may be further satisfied. X is a positive number, and may be about 1 nm to about 10 nm.

$$\text{second pitch a\_e} = \text{first pitch a\_c} + X \qquad \text{Equation (1)}$$

$$\text{second spacing b\_e} \leq \text{first spacing b\_c} + X/2 \qquad \text{Equation (2)}$$

-continued $$\text{first width c\_c} + X/2 \leq \text{second width c\_e} \qquad \text{Equation (3)}$$

$$\text{second spacing b\_e} = \text{first spacing b\_c} \qquad \text{Equation (4)}$$

$$\text{second width c\_e} = \text{first width c\_c} + X \qquad \text{Equation (5)}$$

The gate electrodes 130 may be vertically stacked and spaced apart from each other on the first region A, and may extend from the first region A to the second region B by different lengths. The gate electrodes 130 may include a ground select gate electrode 130G forming or corresponding to a gate of the ground select transistor, memory cell gate electrodes 130M forming or corresponding to a plurality of memory cells, and string select gate electrodes 130S forming or corresponding to a gate of the string select transistor. The number of memory cell gate electrodes 130M included in the memory cells may be determined according to capacity of the semiconductor device 100. In some example embodiments, each of the number of the ground select gate electrode 130G and the number of the string select gate electrodes 130S may be one or two or more, and may have the same or different structure as that of the memory cell gate electrodes 130. A portion of the gate electrodes 130, such as, for example, the memory cell gate electrodes 130M adjacent to the ground select gate electrode 130G and the string select gate electrodes 130S may be dummy gate electrodes, which may not be electrically active during operation of the semiconductor device.

The gate electrodes 130 may be separated in by an amount (such as a dynamically determined amount, or a predetermined amount) in the Y-direction by the first separation regions MS1 extending in the X-direction. The gate electrodes 130 between the pair of first separation regions MS1 may form a memory block, but example embodiments of the memory block is not limited thereto. A portion of the gate electrodes 130, such as, for example, the memory cell gate electrodes 130M, may form or correspond to a layer in a memory block. Specifically, each of the memory cell gate electrodes 130M may include four sub-gate electrodes extending in the X-direction, and the memory cell gate electrodes 130M may be connected to each other in a region in which the second separation regions MS2a and MS2b are spaced apart from each other in the X-direction. The string select gate electrodes 130S may be separated, e.g., completely separated into four sub-gate electrodes by the first and second separation regions MS1, MS2a and MS2b between the pair of first separation regions MS1. The ground select gate electrode 130G may be connected to each other between a portion of the second separation regions MS2a and MS2b, and may be separated to two sub-gate electrodes by the second central separation regions MS2a and the lower separation region GS between the second central separation regions MS2a.

In the second region B of the substrate 101, the gate electrodes 130 may extend to different lengths in the X-direction and may form steps in a staircase shape (e.g., a staircase shape when viewed in cross-section), and may provide pad regions in which the lower gate electrode 130 is exposed upwardly. In some example embodiments, the gate electrodes 130 may form steps in the Y-direction. Each of the gate electrodes 130 may be exposed upwardly in the pad region and may be connected to contact plugs, and accordingly, the gate electrodes 130 may be connected to the upper interconnection structure. In the pad regions, the gate electrodes 130 may have regions having an increased thickness to be stably connected to the contact plugs, but example embodiments thereof is not limited thereto.

The gate electrodes 130 may include a metal material, such as, for example, tungsten (W). In some example embodiments, the gate electrodes 130 may include polycrystalline silicon and/or a metal silicide material. Alternatively or additionally, in some example embodiments, the gate electrodes 130 may further include a diffusion barrier, and for example, the diffusion barrier may include tungsten nitride (WN), tantalum nitride (TaN), or titanium nitride (TiN), or a combination thereof.

The interlayer insulating layers 120 may be disposed between the gate electrodes 130. Similarly to the gate electrodes 130, the interlayer insulating layers 120 may be spaced apart from each other in a direction perpendicular to the upper surface of the substrate 101 and may extend in the X-direction. The interlayer insulating layers 120 may include an insulating material such as silicon oxide and/or silicon nitride.

The first and second separation regions MS1, MS2a, and MS2b may be disposed to extend in the X-direction in the first region A and the second region B. The first and second separation regions MS1, MS2a, and MS2b may be disposed parallel to each other. The first separation regions MS1 and the second separation regions MS2a and MS2b may be disposed to form a uniform pattern in the Y-direction, and the second separation regions MS2a and MS2b may be spaced apart from each other linearly in the X-direction. The first and second separation regions MS1, MS2a, and MS2b may be or may include through separation regions penetrating through the entirety of the gate electrodes 130 stacked on the substrate 101 and connected to the substrate 101.

The first separation regions MS1 may define block regions BLK. The first separation regions MS1 adjacent to each other may define a block region BLK, and the semiconductor device 100 may include a plurality of block regions BLK. The block regions BLK may include the center block regions BLK_C and the edge block regions BLK_E disposed on an external side of the center block regions BLK_C in the third direction. A spacing between the first separation regions MS1 in the third direction Y may be greater in the edge block regions BLK_E than in the center block regions BLK_C. This may be because the first edge channel width w1_e is greater than the first center channel width w1_c.

The second separation regions MS2a and MS2b may include second central separation regions MS2a disposed in the middle of the pair of first separation regions MS1, and second auxiliary separation regions MS2b disposed between the first separation region MS1 and the second central separation regions MS2a. The second central separation regions MS2a may be disposed throughout the first region A and the second region B, and the second auxiliary separation regions MS2b may be disposed only in the second region B. The second central separation regions MS2a may extend from the first region A to a portion of the second region B as a single region, and may be spaced apart from the second region B and may extend as a single region again in the second region B. A plurality of the second auxiliary separation regions MS2b may be isolated from each other linearly by a spacing (such as a dynamically determined or a predetermined spacing). However, the arrangement order and/or the number of the first and second separation regions MS1, MS2a, and MS2b are not limited to the examples illustrated in FIG. 2A. For example, in some example embodiments, the second separation regions MS2a and MS2b may be disposed in four or more columns between the pair of first separation regions MS1 in the Y-direction.

The first and second separation regions MS1, MS2a, and MS2b may include a separation layer 107. The separation layer 107 may include only an insulating material, or may include an insulating material and a conductive material. In some example embodiments, when the separation layer 107 includes a conductive layer spaced apart from the gate electrodes 130 by the insulating layer in addition to the insulating layer, the first separation regions MS1 may include a common source line, and the second separation regions MS2a and MS2b may include a dummy common source line. In this case, the dummy common source line may be in a floating state in which the dummy common source line is not connected to devices driving the semiconductor device 100 or an electrical signal is not applied thereto. In some example embodiments, when the separation layer 107 includes only the insulating layer, a common source line may be disposed in the substrate 101 and/or may be disposed on the substrate 101 so as to be in contact with the upper surface of the substrate 101.

The upper separation regions SS may extend in the X-direction in the first region A between the first separation regions MS1 and the second central separation region MS2a. The upper separation regions SS may be disposed parallel to the second auxiliary separation region MS2b. The upper separation regions SS may be disposed to penetrate a portion of the gate electrodes 130 including the string select gate electrodes 130S among the gate electrodes 130. The string select gate electrodes 130S separated by the upper separation regions SS may form different string select lines.

The upper separation regions SS may include an upper insulating layer 103. The upper insulating layer 103 may isolate electrodes such as three gate electrodes 130 including the string select gate electrodes 130S from each other in the Y-direction. However, the number of gate electrodes 130 separated by the upper insulating layer 103 may be varied in various example embodiments.

The lower separation region GS may be disposed on the same level as a level of lowermost ground select gate electrode 130G. The ground select gate electrode 130G may be separated or divided into two layers in the Y-direction between the pair of first separation regions MS1 by the lower separation region GS. The lower separation regions GS may include regions in which the second central separation regions MS2a are spaced apart from each other and may connect the second central separation regions MS2a to each other.

The lower separation region GS may include a lower insulating layer. The lower insulating layer may be or may be formed of, for example, silicon oxide, and may or may not be the same material as that of the interlayer insulating layer 120.

The channel structures CH may be spaced apart from each other while forming rows and columns on the first region A. The channel structures CH may be disposed to form a grid pattern or may be disposed in a zigzag pattern in one direction. The channel structures CH may have a columnar shape, and may have inclined side surfaces having a width decreasing toward the substrate 101 depending on an aspect ratio. In some example embodiments, the channel structures CH disposed on the end of the first region A, adjacent to the second region B may be dummy channels. Also, the channel structures CH overlapping the upper separation regions SS may be dummy channels. In this case, the dummy channels may have a structure the same as or similar to the channel structures CH, and may not perform a substantial function in the semiconductor device 100.

The channel layer 140 may be disposed in the channel structures CH. In the channel structures CH, the channel layer 140 may be formed in an annular shape surrounding the channel insulating layer 150 therein. However, in some example embodiments, the channel layer 140 may have a column shape such as a cylindrical shape and/or a prism shape without the channel insulating layer 150. The channel layer 140 may be connected to the epitaxial layer 105 in a lower portion, and an insulating layer may be further disposed between the channel layer 140 and the epitaxial layer 105. The channel layer 140 may include a semiconductor material such as polycrystalline silicon or single crystal silicon, and the semiconductor material may be an undoped material or a material including P-type and/or N-type impurities. The channel structures CH disposed linearly in the Y-direction may be connected to different bit lines according to the arrangement of the upper interconnection structure connected to the channel pad 155.

In the channel structures CH, channel pads 155 may be disposed on the channel layer 140. The channel pads 155 may be disposed to cover the upper surface of the channel insulating layer 150 and to be electrically connected to the channel layer 140. The channel pads 155 may include, for example, doped or undoped polycrystalline silicon.

As illustrated in FIGS. 2B and 4B, the channel structures CH may include the first channel structures CH1 adjacent to the first separation region MS1 or the second central separation region MS2a and second to fifth channel structures CH2, CH3, CH4, and CH5 disposed between the first channel structures CH1 in the third direction Y. In some example embodiments, the width and/or spacing of the channel structures CH in the third direction Y may be different in the center block region BLK_C and the edge block region BLK_E. In the center block region BLK_C, the widths of each of the first to fifth channel structures CH1, CH2, CH3, CH4, and CH5 in the third direction Y may be defined as the first to fifth center channel widths w1_c, w2_c, w3_c, w4_c, and w5_c. In the center block region BLK_C, a distance between the center of the first channel structures CH1 and the center of the first separation regions MS1 adjacent to the first channel structures CH1 in the third direction Y may be defined as the first center channel spacing s1_c, a distance between the center of the first channel structures CH1 and the center of the second channel structures CH2 adjacent to the first channel structures CH1 in the third direction Y may be defined as a second center channel distance s2_c, a distance between the center of the second channel structures CH2 and the center of the third channel structures CH3 adjacent to the second channel structures CH2 in the third direction Y may be defined as a third center channel distance s3_c, a distance between the center of the third channel structures CH3 and the center of the fourth channel structures CH4 adjacent to the third channel structures CH3 in the third direction Y may be defined as a fourth center channel distance s4_c, and a distance between the center of the fourth channel structures CH4 and the center of the fifth channel structures CH5 adjacent to the fourth channel structures CH4 in the third direction Y may be defined as a fifth center channel spacing s5_c.

In the edge block region BLK_E, a distance between the center of the first channel structures CH1 and the center of the first separation regions MS1 adjacent to the first channel structures CH1 in the third direction Y may be defined as a first edge channel spacing s1_e, a distance between the center of the first channel structures CH1 and the center of the second channel structures CH2 adjacent to the first channel structures CH1 in the third direction Y may be defined as a second edge channel spacing s2_e, a distance between the center of the second channel structures CH2 and the third channel structures CH3 adjacent to the second channel structures CH2 in the third direction Y may be defined as a third edge channel spacing s3_e, a distance between the center of the third channel structures CH3 and the center of the fourth channel structures CH4 adjacent to the third channel structures CH3 in the third direction Y may be defined as a fourth edge channel spacing s4_e, and a distance between the center of the fourth channel structures CH4 and the center of the fifth channel structures CH5 adjacent to the fourth channel structures CH4 in the third direction Y may be defined as a fifth edge channel spacing s5_e.

In the edge block region BLK_E, widths of the first to fifth channel structures CH1, CH2, CH3, CH4, and CH5 in the third direction Y may be defined as the first to fifth edge channel widths w1_e, w2_e, w3_e, and w4_e, w5_e. First to fifth edge channel spacings s1_e, s2_e, s3_e, s4_e, and s5_e may be formed. The first edge channel width w1_e may be greater than the first center channel width w1_c. This may be to facilitate or help facilitates the etching process for forming the first channel structure CH1 in the edge block region BLK_E during the process of manufacturing the semiconductor device 100. The second to fifth edge channel widths w2_e, w3_e, w4_e, and w5_e may be substantially the same as the second to fifth center channel widths w2_c, w3_c, w4_c, and w5_c, respectively. The second edge channel spacing s2_e may be greater than the second center channel spacing s2_c. This may be to facilitate or help facilitate the etching process for forming the first channel structure CH1 in the edge block region BLK_E during the process of manufacturing the semiconductor device 100. The first, third, fourth, and fifth edge channel spacings s1_e, s3_e, s4_e, and s5_e may be substantially the same as the first, third, fourth, and fifth center channel spacings s1_c, s3_c, s4_c, and s5_c.

The gate dielectric layer 145 may be disposed between the gate electrodes 130 and the channel layer 140. Although not specifically illustrated, the gate dielectric layer 145 may include a tunneling layer, a charge storage layer, and a blocking layer stacked in order from the channel layer 140. The tunneling layer may tunnel electric charges into the charge storage layer, and may include, for example, silicon oxide ($SiO_2$), silicon nitride ($Si_3N_4$), silicon oxynitride (SiON), or a combination thereof. The charge storage layer may be a charge trap layer and/or a floating gate conductive layer. The blocking layer may include silicon oxide ($SiO_2$), silicon nitride ($Si_3N_4$), silicon oxynitride (SiON), a high-k dielectric material, or a combination thereof. In some example embodiments, at least a portion of the gate dielectric layer 145 may extend in a horizontal direction along the gate electrodes 130.

The epitaxial layer 105 may be disposed on the substrate 101 on the lower end of the channel structures CH, and may be disposed on a side surface of the at least one gate electrode 130. The epitaxial layer 105 may be disposed in the recessed region of the substrate 101. The level of the upper surface of the epitaxial layer 105 may be higher than a level of the upper surface of the lowermost gate electrode 130 and may be lower than a level of the lower surface of the upper gate electrode 130, but various example embodiments thereof is not limited thereto. In some example embodiments, the epitaxial layer 105 may not be provided, and in this case, the channel layer 140 may be directly connected to the substrate 101. In some example embodiments, an interface may be present between the epitaxial layer 105 and the substrate 101.

The dummy channel structures DCH may be disposed in the second region B and may have the same or similar structure to the channel structures CH, and may not perform a substantial function in the semiconductor device 100. The dummy channel structures DCH may be disposed to penetrate through the substrate insulating layers 110 and may be connected to the substrate 101. The dummy channel structures DCH may include first dummy channel structures DCH1 disposed on an external side of the lower separation region GS in the Y-direction, second dummy channel structures DCH2 disposed regularly while forming columns and rows in pad regions of the and the gate electrodes 130, and third dummy channel structures DCH3 disposed in at least a portion of a region in which the second auxiliary separation regions MS2b are spaced apart from each other in the X-direction. As described above, the channel structures CH in the first region A may also include a portion of dummy channel structures.

The first dummy channel structures DCH1 may be disposed on both sides of the lower separation region GS in the Y-direction. The first dummy channel structures DCH1 may be disposed between second dummy channel structures DCH2 adjacent to each other in the X-direction. The first dummy channel structures DCH1 may have a maximum diameter greater than maximum diameters of the channel structures CH and the second and third dummy channel structures DCH2 and DCH3. While the channel structures CH and the second and third dummy channel structures DCH2 and DCH3 have a circular shape or a shape similar to a circular shape, the first dummy channel structures DCH1 may have a shape of which a width in the X-direction may be greater than or less than a width in the Y-direction. The first dummy channel structures DCH1 may have one or more of an elongated shape, a rectangular shape, or an elliptical shape extending in the Y-direction.

The second dummy channel structures DCH2 may be disposed in a predetermined manner. When the smallest unit surrounded by the first and second separation regions MS1, MS2a and MS2b in the pad region is referred to as a unit pad region, the second dummy channel structures DCH2 may be disposed on the four corners of a unit pad region, such that the form in which four second dummy channel structures DCH2 are disposed in each unit pad region may be repeated. A maximum diameter of the second dummy channel structures DCH2 may be smaller than a maximum diameter of the first dummy channel structures DCH1, and may be equal to or less than a maximum diameter of the third dummy channel structures DCH3.

The third dummy channel structures DCH3 may be disposed linearly with the first dummy channel structures DCH1 in the Y-direction, and may be disposed in a region in which the second auxiliary separation regions MS2b are spaced apart from each other in the X-direction. The third dummy channel structures DCH3 may be disposed only linearly with the first dummy channel structures DCH1 in the Y-direction, and may not be disposed in the other spaced regions of the second auxiliary separation regions MS2b in the X-direction. In this case, the substrate insulating layers 110 may not extend to the other spaced apart regions as illustrated. However, in some example embodiments, the third dummy channel structures DCH3 may be disposed in the spaced regions of the second auxiliary separation regions MS2b in the X-direction.

Since the dummy channel structures DCH are disposed to penetrate the substrate insulating layers 110, the lower ends of the dummy channel structures DCH may be disposed on a level lower than a level of the lower ends of the channel structures CH. Accordingly, the dummy channel structures DCH may have a level higher than a level of the channel structures CH. Also, the epitaxial layers 105 in the dummy channel structures DCH may be disposed such that at least a portion of a side surface thereof is surrounded by the substrate insulating layers 110. The epitaxial layers 105 in the dummy channel structures DCH may have a relatively low level or a thin thickness when the diameters of the first to third dummy channel structures DCH1, DCH2, and DCH3 are relatively large.

The dummy channel structures DCH may support the stack structure including the interlayer insulating layers 120 so as not to collapse during the process of manufacturing the semiconductor device 100. The region in which the lower separation region GS is disposed may be one of regions vulnerable to collapse during the process of manufacturing the semiconductor device 100. The dummy channel structures DCH may not be disposed to overlap the lower separation region GS, but by disposing the first dummy channel structures DCH1 on both sides of the lower separation region GS, the collapse on the lower separation region GS may be prevented or reduced in likelihood of occurrence.

Alternatively or additionally, the first dummy channel structures DCH1 may be formed to have a relatively large size because there may be less limitations in size than when the first dummy channel structures DCH1 are disposed to overlap the lower separation region GS, and defects due to misalignment may also be prevented or reduced in likelihood of occurrence. Also, since the lower ends of the dummy channel structures DCH penetrate the substrate insulating layers 110 and are disposed on a level lower than a level of the channel structures CH, defects such as short circuit or leakage current between the epitaxial layer 105 and the gate electrodes 130 may be fundamentally prevented or reduced in likelihood of occurrence.

The cell region insulating layer 190 may be disposed on the stack structure of the gate electrodes 130 and may include an insulating material such as silicon oxide or silicon nitride.

Figure 6:
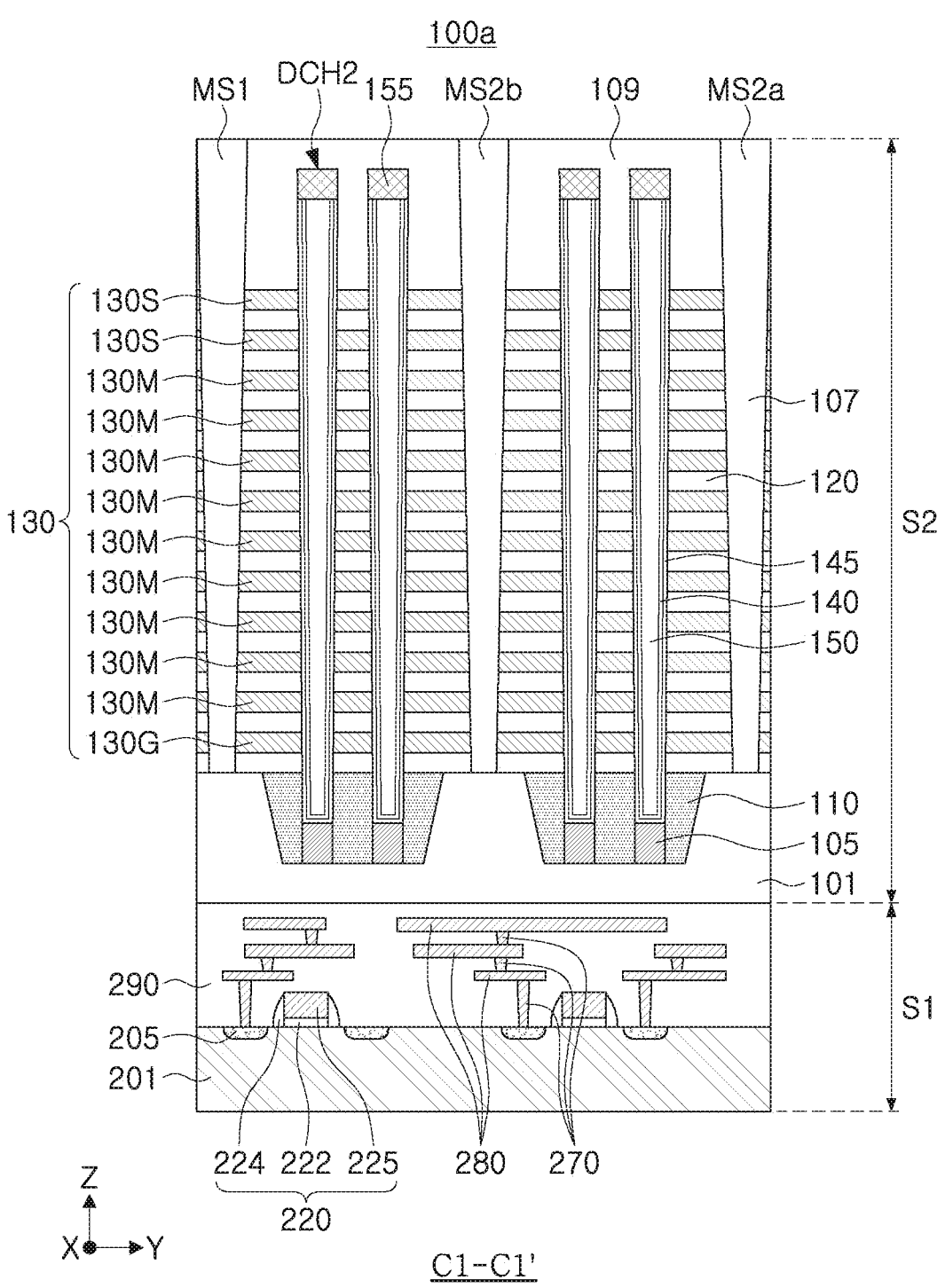
FIG. 6 is a cross-sectional diagram illustrating a semiconductor device according to various example embodiments.

FIG. 6 is a cross-sectional diagram illustrating a semiconductor device according to various example embodiments, illustrating a region corresponding to FIG. 3A.

Figure 7:
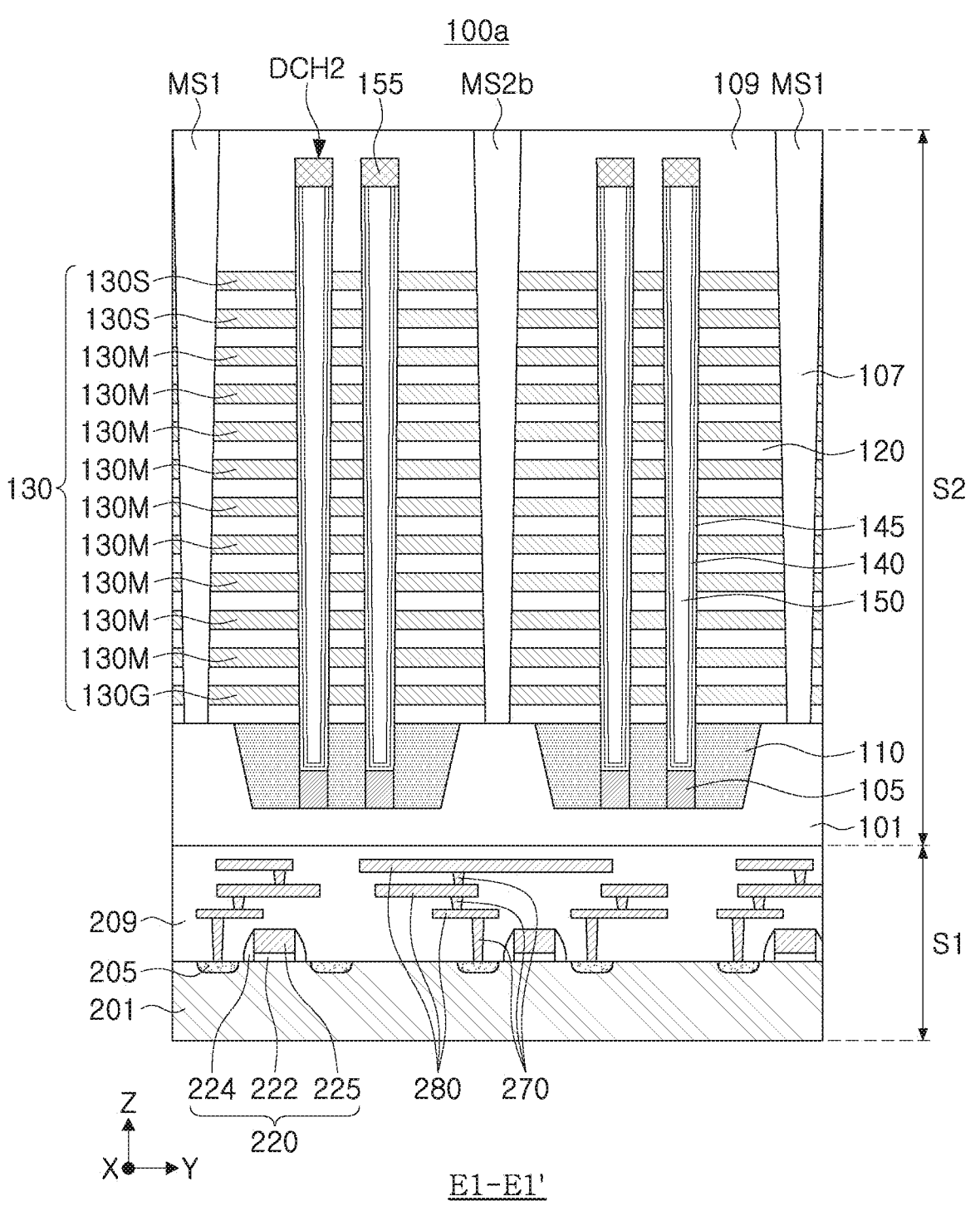
FIG. 7 is a cross-sectional diagram illustrating a semiconductor device according to various example embodiments.

FIG. 7 is a cross-sectional diagram illustrating a semiconductor device according to various example embodiments, illustrating a region corresponding to FIG. 5.

Referring to FIGS. 6 and 7, the semiconductor device 100a may include a second semiconductor structure S2 and a first semiconductor structure S1. The second semiconductor structure S2 may be disposed on the first semiconductor structure S1. In SOME example embodiments, the second semiconductor structure S2 may be disposed below the first semiconductor structure S1.

The first semiconductor structure S1 may include a base substrate 201, circuit devices 220 disposed on the base substrate 201, circuit contact plugs 270, and interconnection lines 280.

The base substrate 201 may have an upper surface extending in the X-direction and the Y-direction. In the base substrate 201, separate device separation layers may be formed such that an active region may be defined. Source/drain regions 205 including impurities may be disposed in a portion of the active region. The base substrate 201 may include a semiconductor material, such as, for example, one or more of a group IV semiconductor, a group III-V compound semiconductor, or a group II-VI oxide semiconductor.

The circuit devices 220 may include a transistor such as a planar transistor, such as an NMOS transistor and/or a PMOS transistor. Each of the circuit devices 220 may include a circuit gate insulating layer 222, a spacer layer 224, and a circuit gate electrode 225. The source/drain regions 205 may be disposed in the base substrate 201 on both sides of the circuit gate electrode 225.

A peripheral region insulating layer 290 may be disposed on the circuit device 220 on the base substrate 201. The circuit contact plugs 270 may penetrate through the peripheral region insulating layer 290 and may be connected to the source/drain regions 205. An electrical signal may be applied to the circuit device 220 by the circuit contact plugs 270. In a region not illustrated, circuit contact plugs 270 may also be connected to the circuit gate electrode 225. The interconnection lines 280 may be connected to the circuit contact plugs 270 and may be disposed in a plurality of layers. In a region not illustrated, the gate electrodes 130 of the second semiconductor structure S2 may be connected to a through-region penetrating the first semiconductor structure S1 and circuit devices 220 of the first semiconductor structure S1 through a through via in the through-region.

The second semiconductor structure S2 may include the substrate 101, the substrate insulating layer 110, the gate electrodes 130, and the channel structures CH and dummy channel structures DCH, first and second separation regions MS1, MS2a and MS2b, and a lower separation region GS, as described above with reference to FIGS. 2A to 5.

In the semiconductor device 100a, the first semiconductor structure S1 may be manufactured or preferentially manufactured, and the substrate 101 of the second semiconductor structure S2 may be formed thereon such that the second semiconductor structure S2 may be manufactured. The substrate 101 may have the same size as that of the base substrate 201 or may be formed to have a size smaller than that of the base substrate 201.

Figure 8:
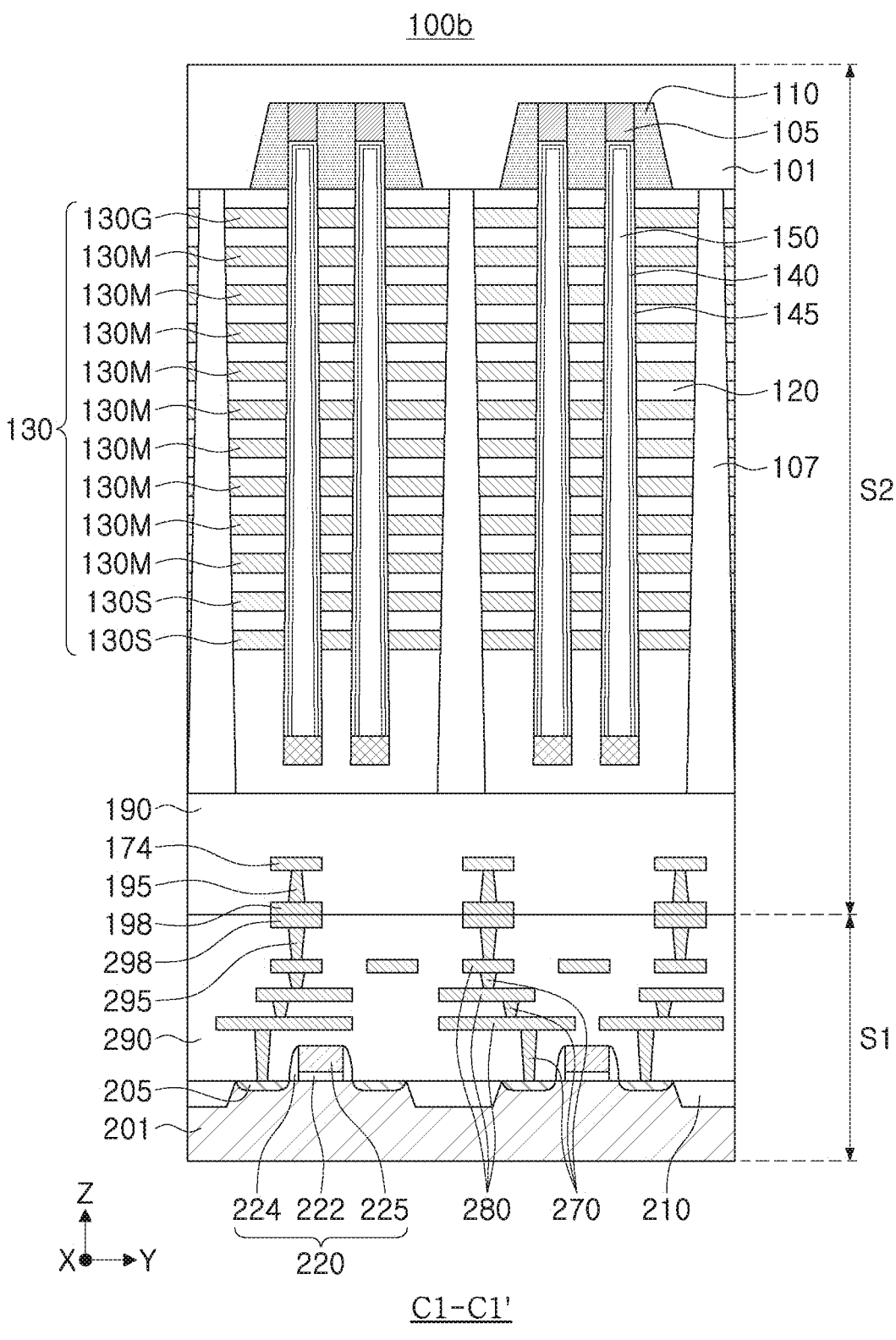
FIG. 8 is a cross-sectional diagram illustrating a semiconductor device according to various example embodiments.

FIG. 8 is a cross-sectional diagram illustrating a semiconductor device according to various example embodiments, illustrating a region corresponding to FIG. 3A.

Figure 9:
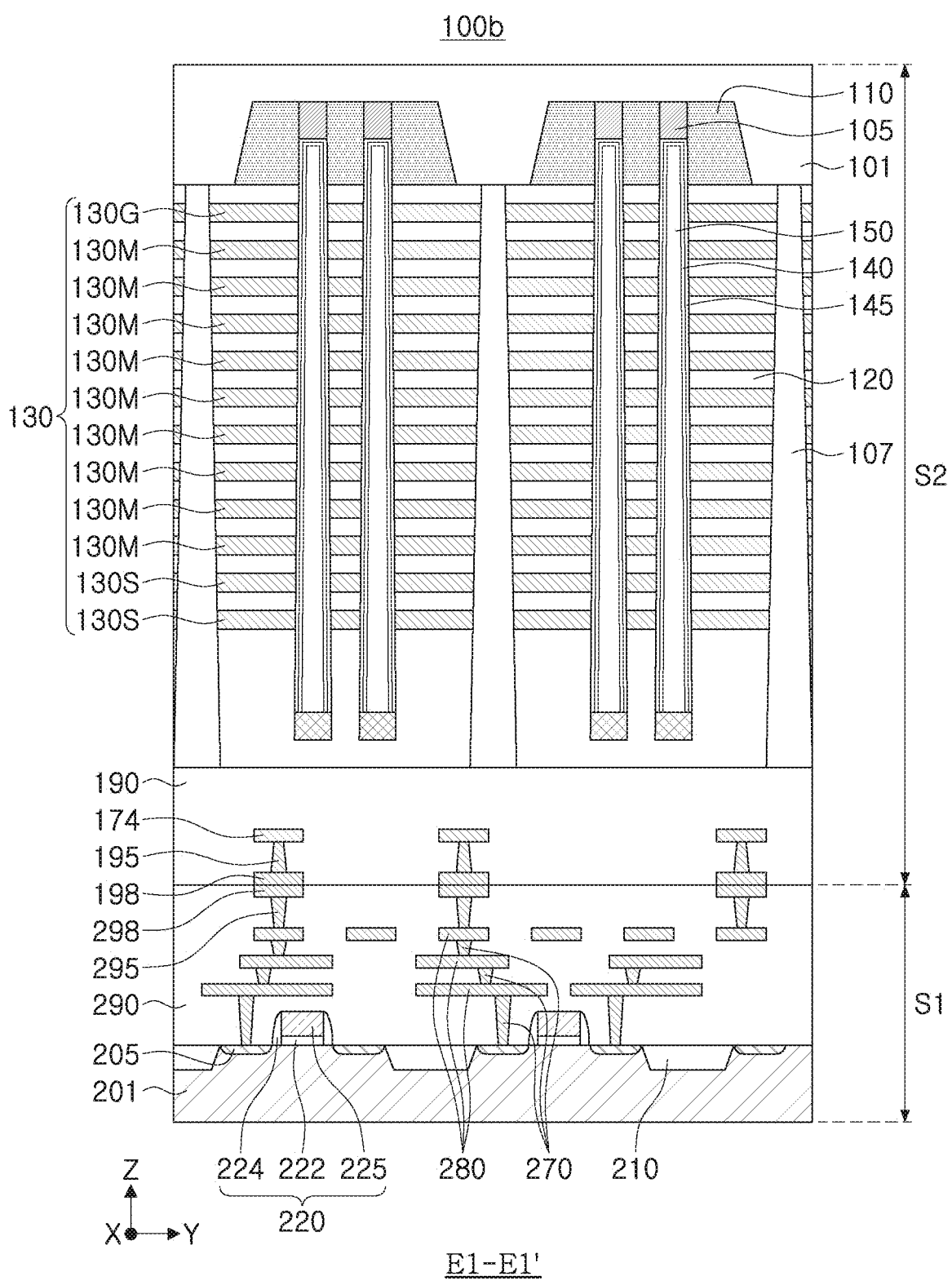
FIG. 9 is a cross-sectional diagram illustrating a semiconductor device according to various example embodiments.

FIG. 9 is a cross-sectional diagram illustrating a semiconductor device according to various example embodiments, illustrating a region corresponding to FIG. 5.

Referring to FIGS. 8 and 9, the semiconductor device 100b may include a first semiconductor structure S1 and a second semiconductor structure S2. The second semiconductor structure S2 may be disposed on the first semiconductor structure S1. In some example embodiments, the second semiconductor structure S2 may be disposed below the first semiconductor structure S1.

As described above with reference to FIGS. 6 and 7, the first semiconductor structure S1 may include a base substrate 201, circuit devices 220 disposed on the base substrate 201, circuit contact plugs 270 and interconnection lines 280. The first semiconductor structure S1 may further include first bonding vias 295 and first bonding metal layers 298.

The first bonding vias 295 and the first bonding metal layers 298 may be included in a first bonding structure and may be disposed on a portion of the interconnection lines 280. The first bonding vias 295 may have a cylindrical shape, and the first bonding metal layers 298 may have a circular pad shape on a plane or a relatively short line shape. Upper surfaces of the first bonding metal layers 298 may be exposed to the upper surface of the first semiconductor structure S1. The first bonding vias 295 and the first bonding metal layers 298 may function as bonding structures or bonding layers of the first semiconductor structure S1 and the second semiconductor structure S2. Also, the first bonding vias 295 and the first bonding metal layers 298 may provide an electrical connection path to the second semiconductor structure S2. In some example embodiments, a portion of the first bonding metal layers 298 may be disposed only for bonding without being connected to the interconnection lines 280. The first bonding vias 295 and the first bonding metal layers 298 may include a conductive material, such as, for example, copper (Cu).

In some example embodiments, the peripheral region insulating layer 290 may include a bonding insulating layer having a predetermined thickness from the upper surface. The bonding insulating layer may be a layer for dielectric-dielectric bonding with the bonding insulating layer of the second semiconductor structure S2. The bonding insulating layer may alternatively or additionally function as a diffusion barrier layer of the first bonding metal layers 298, and may include, for example, at least one of SiO, SiN, SiCN, SiOC, SiON, and SiOCN.

As described above with reference to FIGS. 2A to 5, the second semiconductor structure S2 may include the substrate 101, the substrate insulating layer 110, the gate electrodes 130, the channel structures CH and the dummy channel structures DCH, the first and second separation regions MS1, MS2a, and MS2b, and a lower separation region GS. The second semiconductor structure S2 may further include second bonding vias 195 and second bonding metal layers 198.

The second bonding vias 195 may be disposed below the cell interconnection lines 174 and may be connected to the cell interconnection lines 174, and the second bonding metal layers 198 of the second bonding structure may be connected to the second bonding vias 195. A lower surface of the second bonding metal layers 198 may be exposed to a lower surface of the second semiconductor structure S2. The second bonding metal layers 198 may be bonded to and connected to the first bonding metal layers 298 of the first semiconductor structure S1. The second bonding vias 195 and the second bonding metal layers 198 may include a conductive material, such as, for example, copper (Cu).

In some example embodiments, the cell region insulating layer 190 may include a bonding insulating layer having a predetermined thickness from the lower surface. In this case, the bonding insulating layer may form a dielectric-dielectric bonding with the bonding insulating layer of the first semiconductor structure S1. The bonding insulating layer may include, for example, at least one of SiO, SiN, SiCN, SiOC, SiON, and SiOCN.

The first and second semiconductor structures S1 and S2 may be bonded by bonding between the first bonding metal layers 298 and the second bonding metal layers 198 and bonding between the bonding insulating layers. The bonding between the first bonding metal layers 298 and the second bonding metal layers 198 may be, for example, a copper (Cu)-to-copper (Cu) bonding, and the bonding between the bonding insulating layers may be, for example, dielectric-to-dielectric bonding such as SiCN-to-SiCN bonding. The first and second semiconductor structures S1 and S2 may be bonded by hybrid bonding including copper (Cu)-to-copper (Cu) bonding and dielectric-to-dielectric bonding.

FIGS. 10A to 10E are cross-sectional diagrams illustrating a method of manufacturing a semiconductor device according to various example embodiments, illustrating a region corresponding to FIG. 5.

Figure 10A:
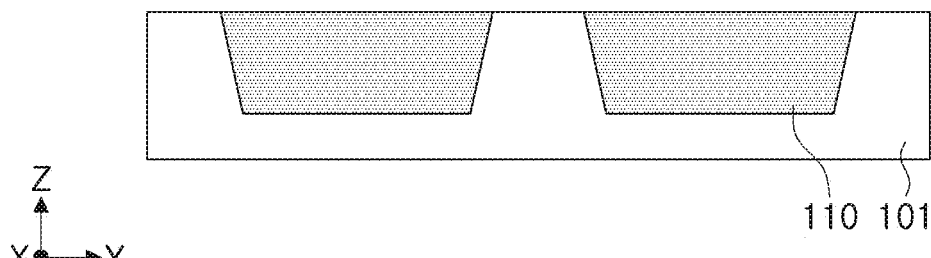
FIGS. 10A to 10E are cross-sectional diagrams illustrating a method of manufacturing a semiconductor device according to various example embodiments.

Referring to FIG. 10A, the substrate insulating layer 110 may be formed in the substrate 101.

First, trench regions may be formed by etching, e.g., anisotropically etching a portion of the substrate 101. The width of the trench regions may decrease toward a lower portion due to an aspect ratio. Thereafter, the trench regions may be filled with an insulating material with a process such as a chemical vapor deposition (CVD) process and/or a spin-on-glass (SOG) process, and a process of planarizing the upper surface of the substrate 101 may be performed. The planarization process may include a chemical-mechanical planarization (CMP) process and/or an etch-back process.

The substrate insulating layer 110 may be subsequently formed in the second region B of the substrate 101 other than regions in which the first and second separation regions MS1, MS2a, and MS2b are disposed. In some example embodiments, when the device isolation layer defining the active region of the substrate 101 is formed in a region not illustrated, the substrate insulating layer 110 may be formed together in the same process as the process of forming the device isolation layer.

Figure 10B:
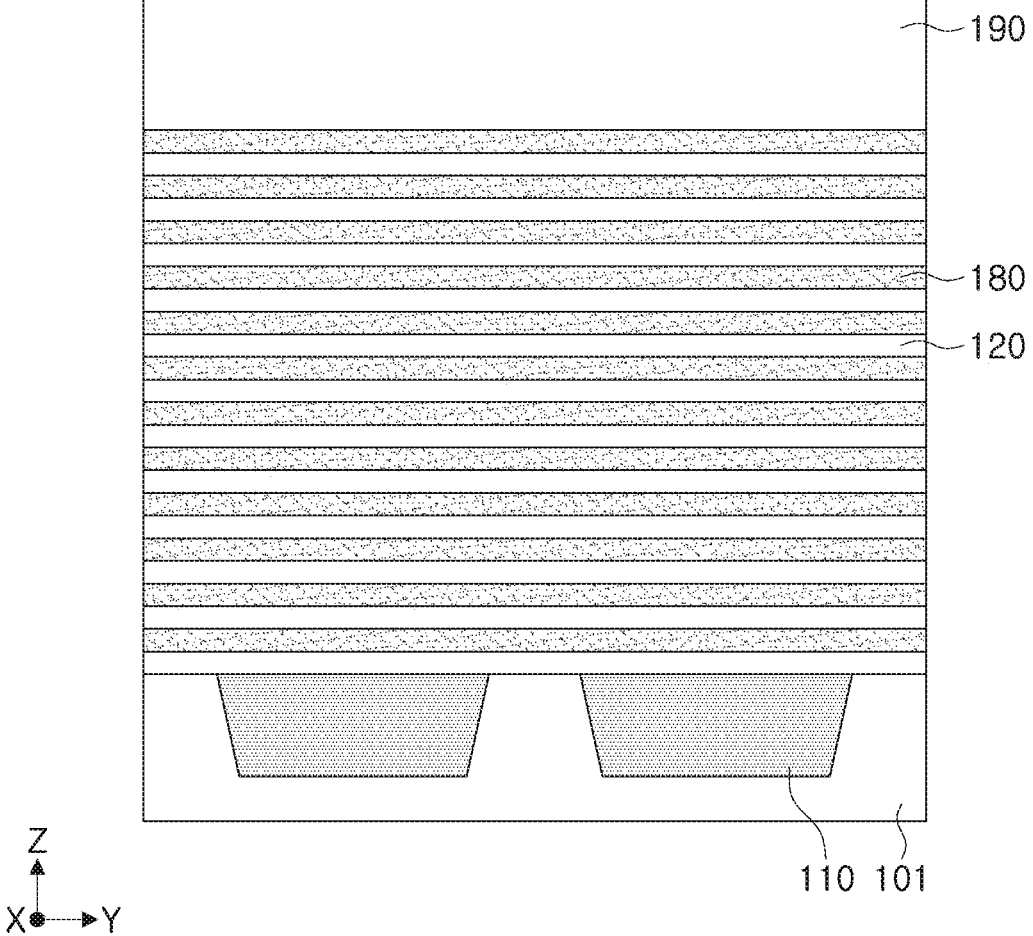

Referring to FIG. 10B, sacrificial layers 180 and interlayer insulating layers 120 may be alternately stacked on a substrate 101, e.g. with an atomic layer deposition (ALD) process, a portion of the sacrificial layers 180 and the interlayer insulating layers 120 may be removed such that the sacrificial layers 180 may extend by different lengths in the X-direction, and the lower separation region GS and an upper separation region SS may be formed.

The sacrificial layers 180 may be layers replaced with the gate electrodes 130 through a subsequent process. The sacrificial layers 180 may be formed of a material etched with etch selectivity with respect to the interlayer insulating layers 120. For example, the interlayer insulating layer 120 may be formed of at least one of silicon oxide and silicon nitride, and the sacrificial layers 180 may be formed of a material different from a material of the interlayer insulating layer 120, selected from among silicon, silicon oxide, silicon carbide, and silicon nitride. In example embodiments, the thicknesses of the interlayer insulating layers 120 may not be the same. For example, the lowermost interlayer insulating layer 120 may be formed to have a relatively thin thickness, and the uppermost interlayer insulating layer 120 may be formed to have a relatively thick thickness. The thickness of the interlayer insulating layers 120 and the sacrificial layers 180 and/or the number of layers included in the interlayer insulating layers 120 and the sacrificial layers 180 may be varied from the illustrated examples, and may or may not be the same as one another.

The lower separation region GS may be formed of a material having etch selectivity with respect to the sacrificial layers 180.

The string separation region SS may extend in the X-direction, and may extend from the first region A to a portion of the second region B. A mask layer may be used to expose a region in which the string separation region SS is to be formed, and a predetermined number of sacrificial layers 180 and interlayer insulating layers 120 may be removed from the uppermost portion.

Thereafter, a cell region insulating layer 190 covering an upper portion of the stack structure of the sacrificial layers 180 and the interlayer insulating layers 120 may be formed.

Figure 10C:
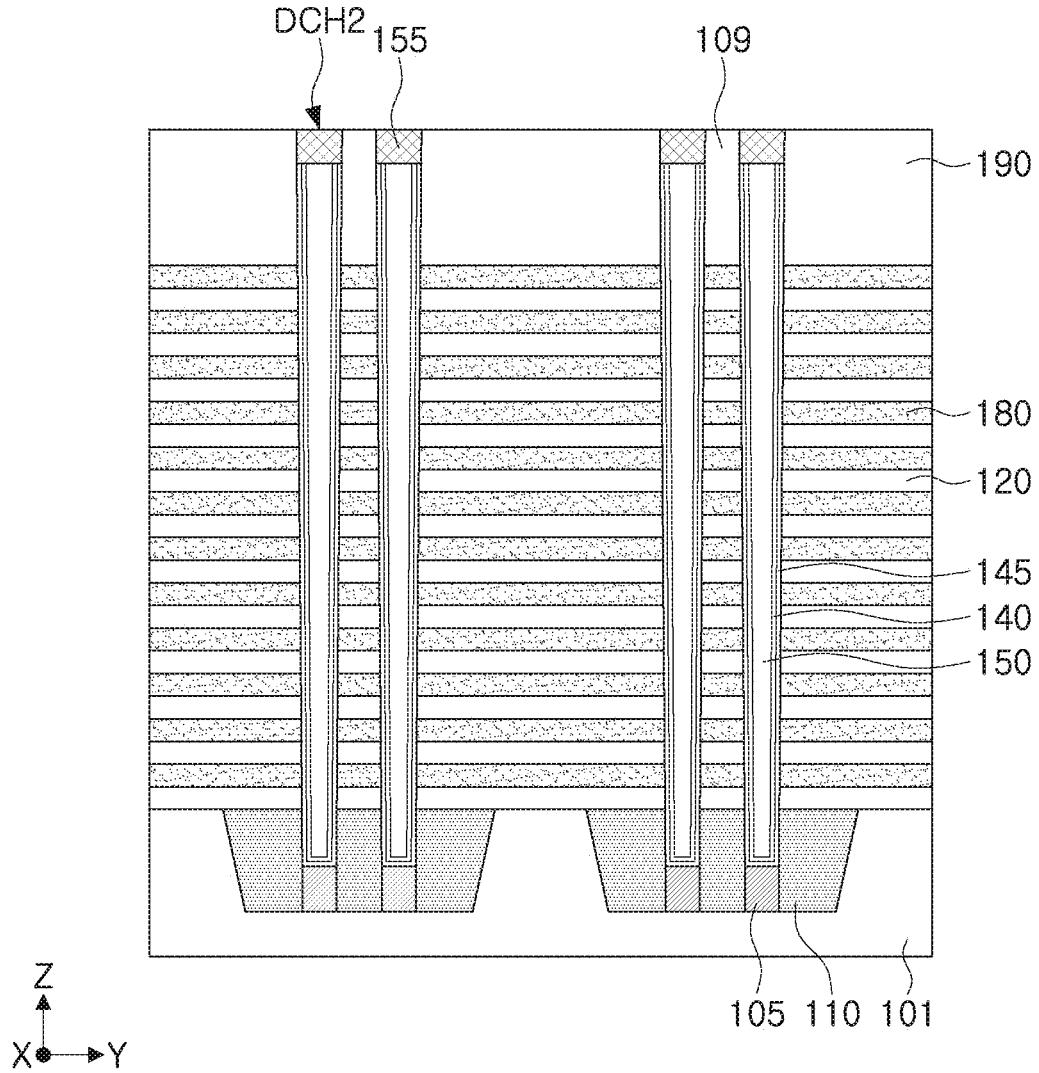

Referring to FIG. 10C, channel structures CH and dummy channel structures DCH penetrating through the stack structure of the sacrificial layers 180 and the interlayer insulating layers 120 may be formed.

The channel structures CH and the dummy channel structures DCH may be formed by anisotropically etching the sacrificial layers 180 and the interlayer insulating layers 120, and may be formed in a hole shape. Due to the height of the stack structure, sidewalls of the channel structures CH and the dummy channel structures DCH may not be perpendicular to the upper surface of the substrate 101. There may be a taper with respect to the channel structures CH and the dummy channel structures DCH. The channel structures CH may be formed in the first region A of the substrate 101, and the dummy channel structures DCH may be formed in the second region B of the substrate 101. The dummy channel structures DCH may be formed to penetrate at least a portion of the substrate insulating layer 110. In some example embodiments, the channel structures CH and the dummy channel structures DCH may be formed to be recessed into a portion of the substrate 101. In some example embodiments, the dummy channel structures DCH may not completely penetrate the substrate insulating layer 110 and may extend only into the substrate insulating layer 110, such that the dummy channel structures DCH may not be in contact with the substrate 101.

Thereafter, in the channel structures CH and the dummy channel structures DCH, the epitaxial layer 105, at least a portion of the gate dielectric layer 145, the channel layer 140, the channel insulating layer 150, and channel pads 155 may be formed. When dummy channel structures are further disposed in the first region A together with the channel structures CH in addition to the dummy channel structures DCH, the dummy channel structures may also be formed together with the channel structures CH in this process.

The epitaxial layer 105 may be formed using a selective epitaxial growth (SEG) process. The epitaxial layer 105 may be formed as a single layer or a plurality of layers. The epitaxial layer 105 may include polycrystalline silicon, single crystal silicon, polycrystalline germanium, or single crystal germanium, and may be doped or undoped with impurities. In the dummy channel structures DCH, the epitaxial layers 105 may be formed such that an upper end is disposed in the substrate insulating layer 110, and at least a portion of a side surface thereof may be surrounded by the substrate insulating layer 110. Accordingly, the epitaxial layers 105 may be spaced apart from the sacrificial layers 180 in the dummy channel structures DCH.

The gate dielectric layer 145 may be formed to have a uniform thickness using atomic layer deposition (ALD) and/or chemical vapor deposition (CVD). In this process, an entirety or a portion of the gate dielectric layer 145 may be formed, and a portion thereof extending perpendicular to the substrate 101 along the channel structures CH and the dummy channel structures DCH may be formed in this process. The channel layer 140 may be formed on the gate dielectric layer 145 in the channel structures CH and the dummy channel structures DCH. The channel insulating layer 150 may be formed to fill the channel structures CH and the dummy channel structures DCH, and may be an insulating material. However, in some example embodiments, the space between the channel layers 140 may be filled with a conductive material instead of the channel insulating layer 150. The channel pad 155 may be formed of a conductive material, such as, for example, polycrystalline silicon.

Figure 10D:
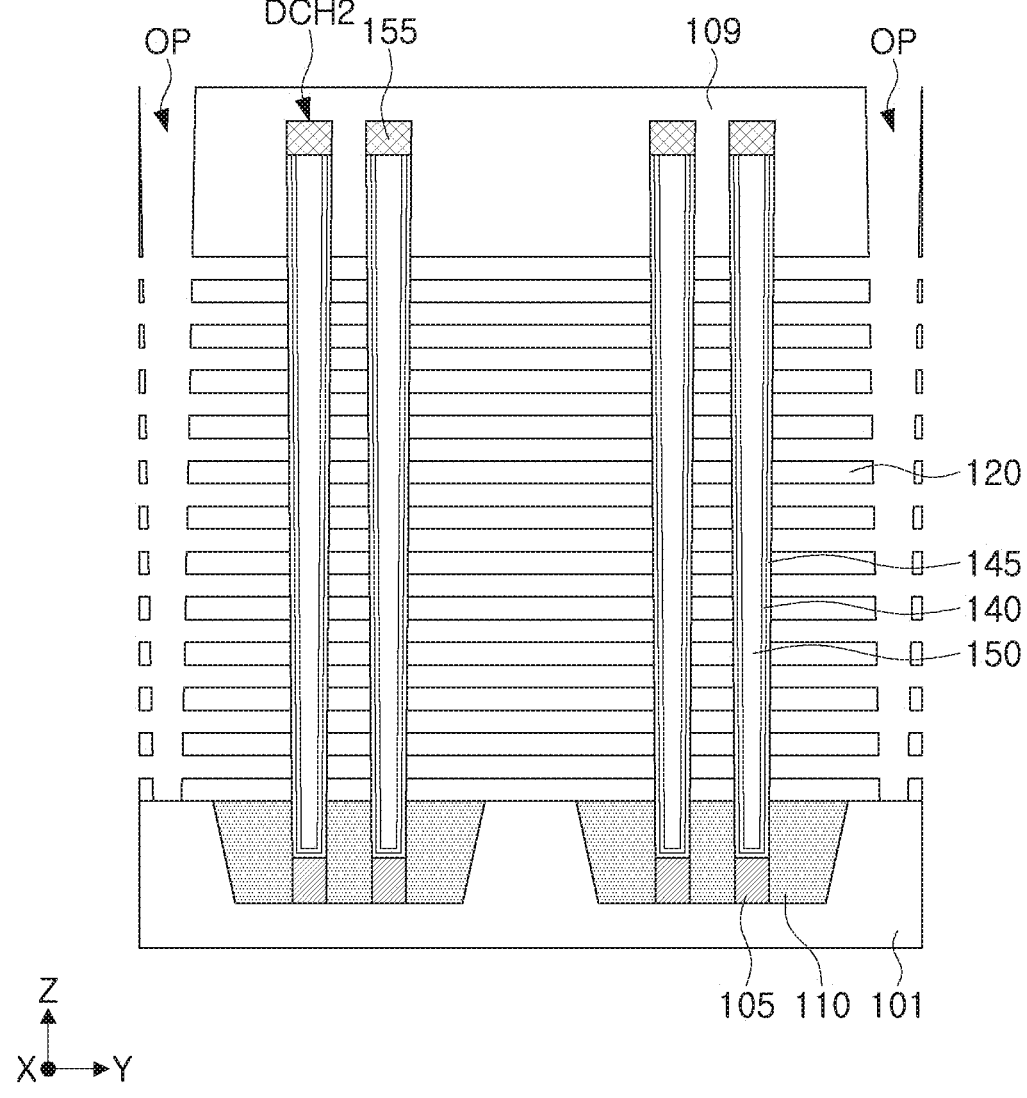

Referring to FIG. 10D, openings OP penetrating through the stack structure of the sacrificial layers 180 and the interlayer insulating layers 120 may be formed, and the sacrificial layers 180 may be removed through the openings OP.

First, the openings OP may be formed by forming a mask layer using a photolithography process and anisotropically etching the stack structure. Before forming the openings OP, a cell region insulating layer 190 may be additionally formed on the channel structures CH and the dummy channel structures DCH to protect the lower structures. The openings OP may be formed in a trench shape in positions corresponding to the first and second separation regions MS1, MS2a, and MS2b. Accordingly, the openings OP may be formed to extend in the X-direction, a portion thereof may extend along the entirety of the first and second regions A and B, and another portion thereof may extend only in the second region B. In this process, the substrate 101 may be exposed below the openings OP.

Thereafter, the sacrificial layers 180 may be selectively removed with respect to the interlayer insulating layers 120 using, for example, wet etching. Accordingly, a plurality of side openings may be formed between the interlayer insulating layers 120, and a portion of sidewalls of the gate dielectric layer 145 of the channel structures CH and side surfaces of the lower separation region GS may be exposed through the side openings. In this process, stability of the stack structure of the interlayer insulating layer 120 may be degraded after the sacrificial layers 180 are removed, but the stack structure may be stably support by the regions in which the openings OP are spaced apart from each other and the dummy channel structures DCH. Also, the first dummy channel structures DCH1 may be disposed to have a relatively large size on an external side of the lower separation region GS, such that the supporting the stack structure by the interlayer insulating layers 120 may be enhanced.

Figure 10E:
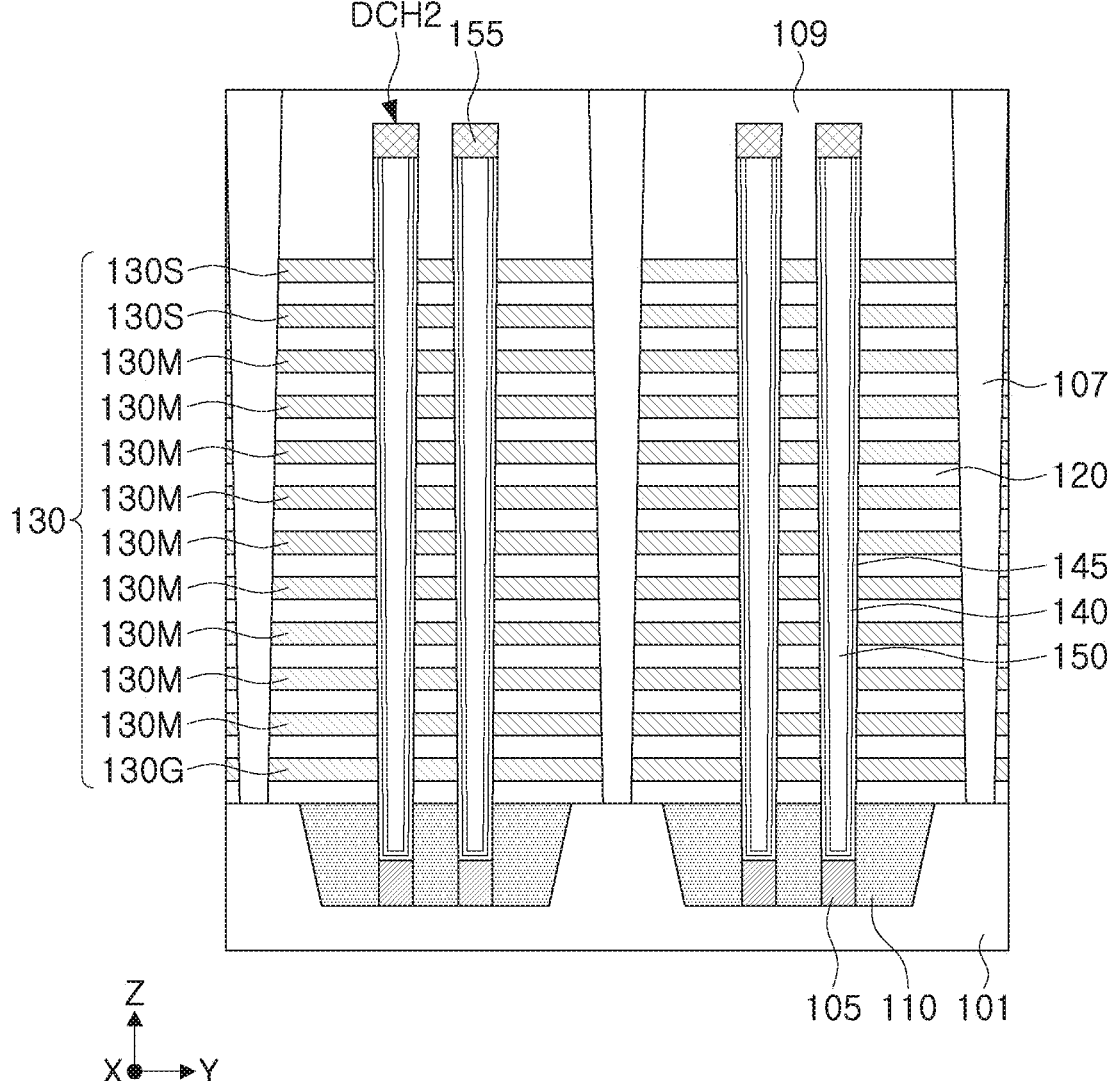

Referring to FIG. 10E, the gate electrodes 130 may be formed by filling a conductive material in the region from which the sacrificial layers 180 are removed.

The gate electrodes 130 may include one or more of a metal, polycrystalline silicon such as doped or undoped polysilicon, or a metal silicide material. The openings OP may provide a material transfer path for forming the gate electrodes 130. The gate electrodes 130 may be connected to each other without being separated between the openings OP spaced apart from each other linearly in the X-direction such that gate connection portions may be formed. After the gate electrodes 130 are formed, the material forming the gate electrodes 130 deposited in the openings OP may be removed through an additional process.

Thereafter, with reference to FIG. 5, the separation layer 107 may be formed in the openings OP.

The separation layer 107 may include an insulating material, and in example embodiments, the separation layer 107 may further include a conductive material in addition to the insulating material. Accordingly, the first and second separation regions MS1, MS2a, and MS2b may be formed, and the first and second separation regions MS1, MS2a, and MS2b may be formed in the same process and may have the same structure.

Thereafter, upper interconnection structures such as contact plugs and bit lines may be further formed on the channel structures CH.

Accordingly, the semiconductor device 100 in FIGS. 1A to 5 may be manufactured.

Figure 11:
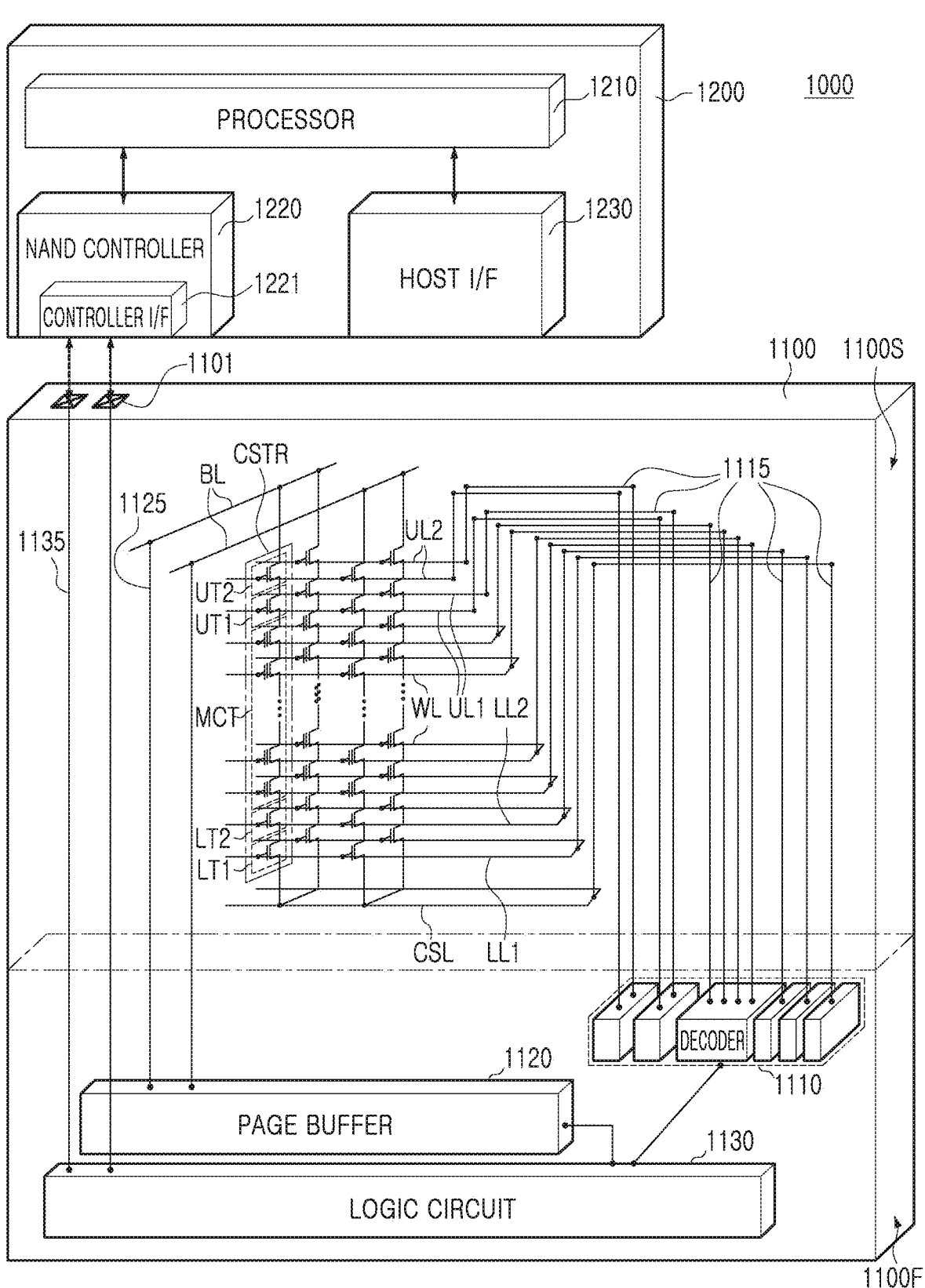
FIG. 11 is a diagram illustrating an electronic system including a semiconductor device according to various example embodiments.

FIG. 11 is a diagram illustrating an electronic system including a semiconductor device according to various example embodiments.

Referring to FIG. 11, the electronic system 1000 may include a semiconductor device 1100 and a controller 1200 electrically connected to the semiconductor device 1100. The electronic system 1000 may be implemented as a storage device including one or a plurality of semiconductor devices 1100 or an electronic device including a storage device. For example, the electronic system 1000 may be implemented as a solid state drive device (SSD) including one or a plurality of semiconductor devices 1100, a universal serial bus (USB), a computing system, a medical device, or a communication device.

The semiconductor device 1100 may be implemented as a non-volatile memory device, such as, for example, the NAND flash memory device described in the aforementioned example embodiment with reference to FIGS. 6 and 7. The semiconductor device 1100 may include a first structure 1100F and a second structure 1100S on the first structure 1100F. In some example embodiments, the first structure 1100F may be disposed on the side of the second structure 1100S. The first structure 1100F may be implemented as a peripheral circuit structure including a decoder circuit 1110, a page buffer 1120, and a logic circuit 1130. The second structure 1100S may be implemented as a memory cell structure including a bit line BL, a common source line CSL, word lines WL, first and second gate upper lines UL1 and UL2, first and second gate lower lines LL1 and LL2 and memory cell strings CSTR disposed between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and/or the number of upper transistors UT1 and UT2 may be varied in various example embodiments.

In some example embodiments, the upper transistors UT1 and UT2 may include a string select transistor, and the lower transistors LT1 and LT2 may include a ground select transistor. The gate lower lines LL1 and LL2 may be configured as gate electrodes of the lower transistors LT1 and LT2, respectively. The word lines WL may be configured as gate electrodes of the memory cell transistors MCT, and the gate upper lines UL1 and UL2 may be configured as gate electrodes of the upper transistors UT1 and UT2, respectively.

In some example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT2 may be used in an erase operation for erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from the first structure 1100F to the second structure 1100S. The bit lines BL may be electrically connected to the page buffer 1120 through second connection interconnections 1125 extending from the first structure 110F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through the input/output pad 1101 electrically connected to the logic circuit 1130. The input/output pad 1101 may be electrically connected to the logic circuit 1130 through an input/output connection line 1135 extending from the first structure 1100F to the second structure 1100S.

The controller 1200 may include a processor 1210, a NAND controller 1220, and a host interface 1230. In example embodiments, the electronic system 1000 may include a plurality of semiconductor devices 1100, and in this case, the controller 1200 may control the plurality of semiconductor devices 1100.

The processor 1210 may control overall operation of the electronic system 1000 including the controller 1200. The processor 1210 may operate according to a firmware (such as a dynamically determined or predetermined firmware), and may access the semiconductor device 1100 by controlling the NAND controller 1220. The NAND controller 1220 may include a controller interface 1221 processing communication with the semiconductor device 1100. Through the controller interface 1221, a control command for controlling the semiconductor device 1100, data to be written to the memory cell transistors MCT of the semiconductor device 1100, and data to be read from the memory cell transistors MCT of the semiconductor device 1100 may be transmitted. The host interface 1230 may provide a communication function between the electronic system 1000 and an external host. When a control command from an external host is received through the host interface 1230, the processor 1210 may control the semiconductor device 1100 in response to the control command.

Figure 12:
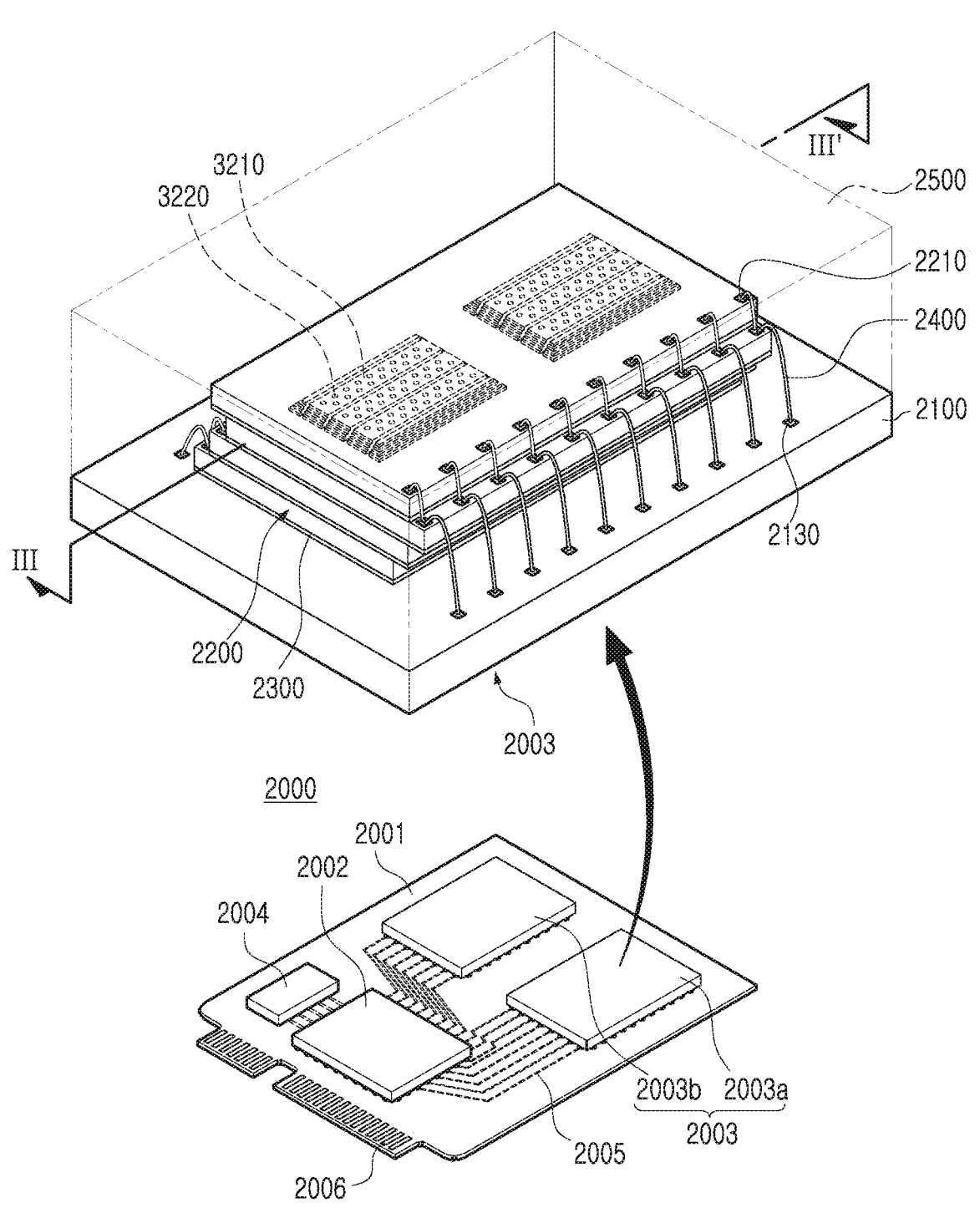
FIG. 12 is a perspective diagram illustrating an electronic system including a semiconductor device according to various example embodiments and FIG. 13 is a cross-sectional diagram illustrating a semiconductor package according to various example embodiments.

FIG. 12 is a perspective diagram illustrating an electronic system including a semiconductor device according to various example embodiments.

Referring to FIG. 12, an electronic system 2000 in various example embodiments may include a main board 2001, a controller 2002 mounted on the main board 2001, one or more semiconductor packages 2003, and a DRAM 2004. The semiconductor package 2003 and the DRAM 2004 may be connected to the controller 2002 by interconnection patterns 2005 formed on the main board 2001.

The main board 2001 may include a connector 2006 including a plurality of pins coupled to an external host. The number and/or the arrangement of the plurality of pins in the connector 2006 may vary depending on a communication interface between the electronic system 2000 and the external host. In some example embodiments, the electronic system 2000 may communicate with an external host according to one or more of interfaces from among universal serial bus (USB), peripheral component interconnect express (PCI-Express), serial advanced technology attachment (SATA), M-Phy for universal flash storage (UFS). In example embodiments, the electronic system 2000 may operate by power supplied from an external host through the connector 2006. The electronic system 2000 may further include a power management integrated circuit (PMIC) for distributing power supplied from the external host to the controller 2002 and the semiconductor package 2003.

The controller 2002 may write data to and/or may read data from the semiconductor package 2003, and may improve an operating speed of the electronic system 2000.

The DRAM 2004 may be configured as a buffer memory for alleviating a difference in speeds between the semiconductor package 2003, which is a data storage space, and an external host. The DRAM 2004 included in the electronic system 2000 may operate as a cache memory, and may provide a space for temporarily storing data in a control operation for the semiconductor package 2003. When the electronic system 2000 may include the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include an input/output pad 2210. The input/output pad 2210 may correspond to the input/output pad 1101 in FIG. 11. Each of the semiconductor chips 2200 may include gate stack structures 3210 and channel structures 3220. Each of the semiconductor chips 2200 may include the semiconductor device described in the aforementioned example embodiment with reference to FIGS. 6 and 7.

In some example embodiments, the connection structure 2400 may be configured as a bonding wire electrically connecting the input/output pad 2210 to the upper package pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure including a through-electrode (TSV) instead of the connection structure 2400 of a bonding wire method.

In some example embodiments, the controller 2002 and the semiconductor chips 2200 may be included in a single package. In various example embodiments, the controller 2002 and the semiconductor chips 2200 may be mounted on a separate interposer substrate different from the main board 2001, and the controller 2002 and the semiconductor chips 2200 may be connected to each other interconnection formed on the interposer substrate.

Figure 13:
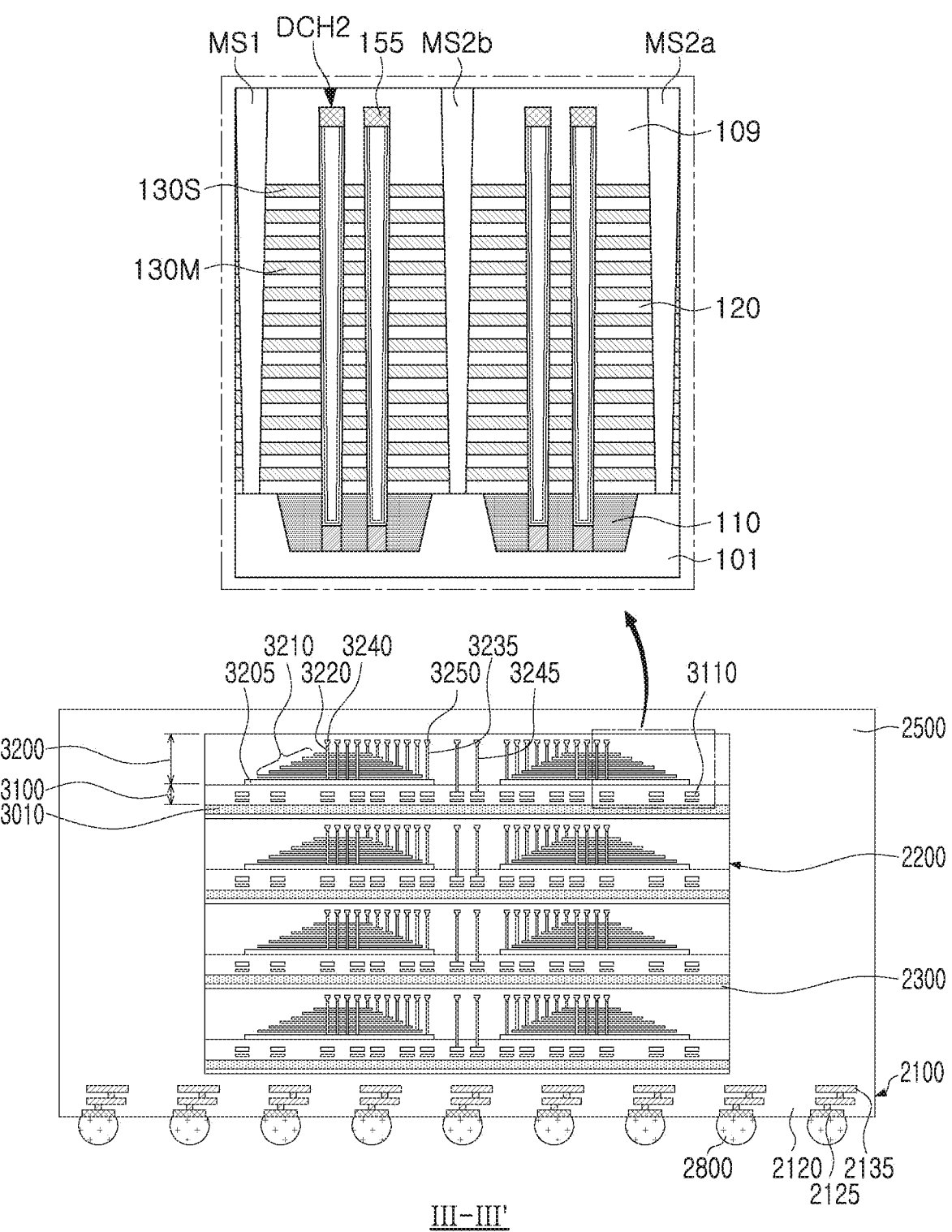

FIG. 13 is a cross-sectional diagram illustrating a semiconductor package according to various example embodiments, illustrating various example embodiments of the semiconductor package 2003 in FIG. 12 taken along line III-III' in FIG. 12.

Referring to FIG. 13, in the semiconductor package 2003, the package substrate 2100 may be implemented as a printed circuit board. The package substrate 2100 may include a package substrate body 2120, package upper pads 2130 (see FIG. 12) disposed on the upper surface of the package substrate body 2120, lower pads 2125 disposed on the lower surface of the package substrate body 2120 or exposed through the lower surface, and internal interconnections 2135 electrically connecting the upper pads 2130 to the lower pads 2125 in the package substrate body 2120. The lower pads 2125 may be connected to the interconnection patterns 2005 of the main substrate 2010 of the electronic system 2000 as illustrated in FIG. 12 through conductive connection portions 2800.

Each of or at least some of the semiconductor chips 2200 may include a semiconductor substrate 3010 and a first structure 3100 and a second structure 3200 stacked in sequence on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 and separation regions penetrating through the gate stack structure 3210, bit lines 3240 electrically connected to the memory channel structures 3220, and gate contact plugs 3235 electrically connected to the word lines WL (see FIG. 11) of the gate stack structure 3210.

Each of or at least some of the semiconductor chips 2200 may include a through interconnection 3245 electrically connected to the peripheral interconnections 3110 of the first structure 3100 and extending into the second structure 3200. The through interconnection 3245 may be disposed on an external side of the gate stack structure 3210, and may be further disposed to penetrate through the gate stack structure 3210. Each of the semiconductor chips 2200 may further include an input/output pad 2210 (see FIG. 12) electrically connected to the peripheral interconnections 3110 of the first structure 3100.

According to the aforementioned various example embodiments, by increasing the width of the substrate insulating layers in the external block region than in the central block region, a semiconductor device having improved electrical properties and reliability and an electronic system including the same may be provided.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc. [0001] When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While example embodiments have been illustrated and described above, it will be configured as apparent to those of ordinary skill in the art that modifications and variations could be made without departing from the scope as defined by the appended claims. Additionally example embodiments are not necessarily mutually exclusive with one another. For example, some example embodiments may include one or more features described with reference to one or more figures, and may also include one or more other features described with reference to one or more other drawings.

What is claimed is:

1. A semiconductor device, comprising:
a substrate having a first region and a second region;
gate electrodes on the first region of the substrate and stacked and spaced apart from each other in a first direction perpendicular to an upper surface of the substrate, and extending by different lengths on the second region of the substrate in a second direction perpendicular to the first direction;
channel structures penetrating through the gate electrodes and extending perpendicularly to the substrate on the first region of the substrate;
separation regions penetrating through the gate electrodes, extending in the second direction, spaced apart from each other in a third direction perpendicular to the first and second directions, and defining a center block region and an edge block region on an external side of the center block region; and
substrate insulating layers in the second region of the substrate,
wherein in the third direction below the center block region the substrate insulating layers have a first width, a first spacing, and a first pitch which is a sum of the first width and the first spacing,
in the third direction below the edge block region the substrate insulating layers have a second width, a second spacing, and a second pitch which is a sum of the second width and the second spacing, and
equations (1) to (3) as below are satisfied, and X is a positive number:

$$\text{second pitch} = \text{first pitch} + X \qquad \text{Equation (1)}$$

$$\text{second spacing} \leq \text{first spacing} + X/2 \qquad \text{Equation (2)}$$

$$\text{first width} + X/2 \leq \text{second width.} \qquad \text{Equation (3)}$$

2. The semiconductor device of claim 1, wherein equations (4) and (5) as below are satisfied:

$$\text{second spacing} = \text{first spacing} \qquad \text{Equation (4)}$$

$$\text{second width} = \text{first width} + X. \qquad \text{Equation (5)}$$

3. The semiconductor device of claim 1, wherein X is 1 nm to 10 nm.

4. The semiconductor device of claim 1, further comprising:

a dummy channel structure penetrating the substrate insulating layers in the second region and extending perpendicularly to the substrate.

5. The semiconductor device of claim 1, wherein the channel structures further include first channel structures adjacent to the separation regions and second channel structures between the first channel structures.

6. The semiconductor device of claim 5, wherein a width of the first channel structures in the third direction is greater in the edge block region than in the center block region.

7. The semiconductor device of claim 6, wherein the first channel structures have an elliptical shape in which a width in the third direction is greater than a width in the second direction in the edge block region.

8. The semiconductor device of claim 6, wherein a width of the second channel structures in the third direction is the same in the center block region and in the edge block region.

9. The semiconductor device of claim 5, wherein a distance in the third direction between centers of the first channel structures and centers of the second channel structures adjacent to the first channel structures is greater in the edge block region than in the center block region.

10. The semiconductor device of claim 9, wherein a distance in the third direction between centers of the first channel structures and centers of the separation regions adjacent to the first channel structures is the same in the center block region and in the edge block region.

11. The semiconductor device of claim 4, wherein the channel structure includes a first epitaxial layer on the substrate on a lower end of the channel structure and on a side surface of at least one gate electrode.

12. The semiconductor device of claim 11, wherein the dummy channel structure includes a second epitaxial layer on the substrate on a lower end of the dummy channel structure and surrounded by the substrate insulating layer.

13. A semiconductor device, comprising:

a first semiconductor structure including a first substrate and circuit devices on the first substrate; and a second semiconductor structure including a second substrate on the first semiconductor structure and having a first region and a second region, gate electrodes in the first region and stacked and spaced apart from each other in a first direction perpendicular to an upper surface of the second substrate, and extending in the second region by different lengths in a second direction perpendicular to the first direction, channel structures extending by penetrating through the gate electrodes, separation regions penetrating through the gate electrodes, extending in the second direction, spaced apart from each other in a third direction perpendicular to the first and second directions, and defining a center block region and an edge block region on an external side of the center block region, and substrate insulating layers in the second substrate between the separation regions in the second region, wherein a width of the substrate insulating layers in the third direction is greater in the edge block region than in the center block region.

14. The semiconductor device of claim 13, wherein a pitch of the substrate insulating layers in the third direction is greater in the edge block region than in the center block region.

15. The semiconductor device of claim 13, wherein a spacing between the substrate insulating layers in the third direction is greater in the edge block region than in the center block region or is the same in the edge block region and in the center block region.

16. The semiconductor device of claim 13, wherein a spacing between the separation regions in the third direction is greater in the edge block region than in the center block region.

17. The semiconductor device of claim 13, wherein the second semiconductor structure further includes dummy channel structures in the second region that extend by penetrating through the substrate insulating layers, and a spacing between the dummy channel structures in the third direction is greater in the edge block region than in the center block region.

18. The semiconductor device of claim 13, wherein the first semiconductor structure further includes a first interconnection structure electrically connected to the circuit devices and a first bonding structure connected to the first interconnection structure, and the second semiconductor structure further includes a second interconnection structure below the channel structures and the gate electrodes, and a second bonding structure connected to the second interconnection structure and bonded to the first bonding structure.

19. An electronic system, comprising:

a semiconductor device including a first semiconductor structure including a first substrate and circuit devices on the first substrate, and a second semiconductor structure including a second substrate on the first semiconductor structure and having a first region and a second region, gate electrodes in the first region and stacked and spaced apart from each other in a first direction perpendicular to an upper surface of the second substrate, and extending in the second region by different lengths in a second direction perpendicular to the first direction, channel structures extending by penetrating through the gate electrodes, separation regions penetrating through the gate electrodes, extending in the second direction, spaced apart from each other in a third direction perpendicular to the first and second directions, and defining a center block region and an edge block region on an external side of the center block region on the first and second regions, substrate insulating layers in the second substrate between the separation regions in the second region, and input/output pads electrically connected to the circuit devices, wherein a pitch of the substrate insulating layers in the third direction is greater in the edge block region than in the center block region, and a width of the substrate insulating layers in the third direction is greater in the edge block region than in the center block region; and a controller electrically connected to the semiconductor device through the input/output pad and configured to control the semiconductor device.

20. The semiconductor device of claim 19, wherein a spacing between the substrate insulating layers in the third direction is greater in the edge block region than in the center block region or is the same in the edge block region and in the center block region, and a spacing between the separation regions in the third direction is greater in the edge block region than in the center block region.

\* \* \* \* \*